United States Patent
Lee et al.

(10) Patent No.: US 9,559,260 B2
(45) Date of Patent: Jan. 31, 2017

(54) SEMICONDUCTOR LIGHT EMITTING DEVICE, METHOD FOR MANUFACTURING SEMICONDUCTOR LIGHT EMITTING DEVICE, AND METHOD FOR MANUFACTURING SEMICONDUCTOR LIGHT EMITTING DEVICE PACKAGE

(71) Applicants: Dong Kuk Lee, Suwon-si (KR); Geun Woo Ko, Suwon-si (KR); Geon-Wook Yoo, Seongnam-si (KR); Nam Goo Cha, Hwaseong-si (KR)

(72) Inventors: Dong Kuk Lee, Suwon-si (KR); Geun Woo Ko, Suwon-si (KR); Geon-Wook Yoo, Seongnam-si (KR); Nam Goo Cha, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/723,869

(22) Filed: May 28, 2015

(65) Prior Publication Data
US 2016/0020358 A1 Jan. 21, 2016

(30) Foreign Application Priority Data
Jul. 21, 2014 (KR) .................. 10-2014-0091930

(51) Int. Cl.
| | |
|---|---|
| *H01L 33/24* | (2010.01) |
| *H01L 33/08* | (2010.01) |
| *H01L 33/42* | (2010.01) |
| *H01L 33/32* | (2010.01) |
| *H01L 33/18* | (2010.01) |
| *H01L 33/20* | (2010.01) |
| *H01L 33/22* | (2010.01) |
| *H01L 33/38* | (2010.01) |

(52) U.S. Cl.
CPC .............. *H01L 33/24* (2013.01); *H01L 33/08* (2013.01); *H01L 33/18* (2013.01); *H01L 33/20* (2013.01); *H01L 33/22* (2013.01); *H01L 33/38* (2013.01)

(58) Field of Classification Search
CPC .......... H01L 33/24; H01L 33/08; H01L 33/18; H01L 33/38; H01L 33/20; H01L 33/22
USPC ........................................................ 257/13
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| JP | 2008079294 A | 4/2008 |
| KR | 100404170 B1 | 10/2003 |

(Continued)

*Primary Examiner* — Walter H Swanson
(74) *Attorney, Agent, or Firm* — Harness, Dickey & Pierce, PLC

(57) ABSTRACT

There is provided a semiconductor light emitting device 100 including a substructure 101, 120, 130 including at least one light emitting region R1 including a plurality of three-dimensional (3-D) light emitting nanostructures 140 and at least one electrode region R2, R3 including a plurality of locations CP2A, 17A, 17B, 18A, 18B wherein an arrangement of the plurality of three-dimensional (3-D) light emitting nanostructures 140 and the plurality of locations CP2A, 17A, 17B, 18A, 18B are identical.

20 Claims, 21 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,183,582 B2 | 5/2012 | Daniels |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,525,404 B2 | 9/2013 | Jeon et al. |
| 8,536,604 B2 | 9/2013 | Kwak et al. |
| 8,735,931 B2 | 5/2014 | Han et al. |
| 8,766,295 B2 | 7/2014 | Kim |
| 2007/0194325 A1 | 8/2007 | Sung et al. |
| 2008/0042149 A1 | 2/2008 | Yoon et al. |
| 2008/0051039 A1 | 2/2008 | Iwasaki et al. |
| 2010/0314717 A1 | 12/2010 | Sakai |
| 2011/0151647 A1 | 6/2011 | Sakai |
| 2013/0075693 A1* | 3/2013 | Svensson ............ H01L 29/0676 257/13 |
| 2013/0248816 A1 | 9/2013 | Chu et al. |
| 2013/0288407 A1 | 10/2013 | Lo |
| 2015/0102365 A1 | 4/2015 | Cha et al. |
| 2015/0155432 A1 | 6/2015 | Yoo et al. |

FOREIGN PATENT DOCUMENTS

| | | |
|---|---|---|
| KR | 100815226 B1 | 3/2008 |
| KR | 10-0865754 B1 | 10/2008 |
| KR | 100912448 B1 | 8/2009 |
| KR | 20090115535 A | 11/2009 |
| KR | 20100132910 A | 12/2010 |
| KR | 20110093635 A | 8/2011 |
| KR | 1097456 B1 | 12/2011 |
| KR | 20130092100 A | 8/2013 |
| KR | 20150043152 A | 4/2015 |
| KR | 10-2015-0064413 A | 6/2015 |

* cited by examiner

SEMICONDUCTOR LIGHT EMITTING DEVICE, METHOD FOR MANUFACTURING SEMICONDUCTOR LIGHT EMITTING DEVICE, AND METHOD FOR MANUFACTURING SEMICONDUCTOR LIGHT EMITTING DEVICE PACKAGE

CROSS-REFERENCE TO RELATED APPLICATION

This application claims priority to Korean Patent Application No. 10-2014-0091930, filed on Jul. 21, 2014, with the Korean Intellectual Property Office, the entire disclosure of which is incorporated herein by reference.

BACKGROUND

The present disclosure relates to a semiconductor light emitting device, a method for manufacturing a semiconductor light emitting device, and a method for manufacturing a semiconductor light emitting device package.

Light Emitting Diodes (LEDs) have many advantages as compared to related art light sources, such as relatively long lifespans, low degrees of power consumption, rapid response speeds, environmental friendliness, and the like, and have thus been widely seen as next generation lighting sources and have increased in prominence as a type of light source for use in various products, such as in general lighting devices and in the backlights of display devices. For example, LEDs based on Group III nitrides, such as gallium nitride (GaN), aluminum gallium nitride (AlGaN), indium gallium nitride (InGaN), indium aluminum gallium nitride (InAlGaN), and the like, may play a role as semiconductor light emitting devices outputting blue or ultraviolet light.

Recently, as LEDs have come into more widespread use, the utilization thereof has extended to the light sources of devices for use in high current and high output applications. Demand for LEDs in devices for use in high current and high output applications has spurred ongoing research in the art to which the present disclosure is directed into improvements in light emitting characteristics. For example, in order to increase luminous efficiency through enhancements in crystallinity and increases in light emitting areas, semiconductor light emitting devices having light emitting nanostructures and manufacturing techniques therefor have been proposed.

SUMMARY

An aspect of the present disclosure may provide a semiconductor light emitting device having enhanced light emitting characteristics (optical characteristics or optical properties), a method for manufacturing a semiconductor light emitting device, and a method for manufacturing a semiconductor light emitting device package.

According to an aspect of the present disclosure, a semiconductor light emitting device may include:

In some example embodiments, a semiconductor light emitting device may comprise a substructure including at least one light emitting region including a plurality of three-dimensional (3-D) light emitting nanostructures and at least one electrode region including a plurality of locations, wherein an arrangement of the plurality of three-dimensional (3-D) light emitting nanostructures and the plurality of locations are identical.

In some example embodiments, the plurality of locations are at least one of depressions, protrusions, and locations where other light emitting nanostructures were formed and removed.

In some example embodiments, the at least one electrode region may include a first conductivity-type semiconductor region and a second conductivity-type semiconductor region.

In some example embodiments, each three-dimensional (3-D) nanostructure may include a first conductivity-type semiconductor core, an active layer, and a second conductivity-type semiconductor shell.

In some example embodiments, the substructure may further include a substrate, a base layer on the substrate, and a mask layer on the base layer.

In some example embodiments, the semiconductor light emitting device may further comprise a first conductivity-type electrode on the base layer and a second conductivity-type electrode on the mask layer.

In some example embodiments, the semiconductor light emitting device may further comprise a transparent electrode layer covering the plurality of three-dimensional (3-D) light emitting nanostructures.

In some example embodiments, the semiconductor light emitting device may further comprise a filler layer on the transparent electrode layer and the plurality of three-dimensional (3-D) light emitting nanostructures.

In some example embodiments, the semiconductor light emitting device may further comprise an electrode insulating layer between the mask layer and the second conductivity-type electrode.

In some example embodiments, the plurality of three-dimensional (3-D) light emitting nanostructures are arranged in a hexagonal pattern of equal pitch.

In some example embodiments, the first conductivity-type semiconductor core is made of an n-type gallium nitride (n-GaN) doped with silicon (Si) or carbon (C), the active layer includes indium gallium nitride (InGaN), and the second conductivity-type semiconductor shell is made of a p-type gallium nitride (p-GaN) doped with magnesium (Mg) or zinc (Zn).

In some example embodiments, the at least one light emitting region may include three light emitting regions each including a plurality of three-dimensional (3-D) light emitting nanostructures having different pitches.

In some example embodiments, the plurality of three-dimensional (3-D) light emitting nanostructures with greater pitches may further have at least one of greater growth thickness, greater Indium (In) content and greater wavelength.

In some example embodiments, a pitch between the centers of two of the plurality of three-dimensional (3-D) light emitting nanostructures, a pitch between the centers of the light emitting nanostructure and the plurality of locations, and a pitch between the plurality of locations are all substantially equal.

In some example embodiments, a cross-sectional area of each of the plurality of locations is greater than a cross-section of each of the plurality of three-dimensional (3-D) light emitting nanostructures.

In some example embodiments, each three-dimensional (3-D) nanostructure may further include a highly resistive layer on a portion of the first conductivity-type semiconductor core.

In some example embodiments, a semiconductor light emitting device comprises a substrate including at least one light emitting region and at least one electrode region, a base layer on the substrate, a mask layer on the base layer, a plurality of three-dimensional (3-D) light emitting nanostructures in a plurality of opening in the mask layer in the at least one light emitting region, and first and second electrodes in a first and second electrode region, respectively. The first and second electrodes, the mask layer in the at least one electrode region, and the base layer in the first and second electrode region each have a plurality of locations having a common pattern with a pattern of the plurality of three-dimensional (3-D) light emitting nanostructures in the at least one light emitting region and a common pattern with each other.

In some example embodiments, the semiconductor light emitting device may further comprise a transparent electrode layer covering the plurality of three-dimensional (3-D) light emitting nanostructures, a filler layer on the transparent electrode layer and the plurality of three-dimensional (3-D) light emitting nanostructures, and an electrode insulating layer between the mask layer and the second electrode.

In some example embodiments, each of the plurality of three-dimensional (3-D) nanostructures includes a first conductivity-type semiconductor core, an active layer, and a second conductivity-type semiconductor shell.

In some example embodiments, the first conductivity-type semiconductor core is made of an n-type gallium nitride (n-GaN) doped with silicon (Si) or carbon (C), the active layer includes indium gallium nitride (InGaN), and the second conductivity-type semiconductor shell 146 is made of a p-type gallium nitride (p-GaN) doped with magnesium (Mg) or zinc (Zn).

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
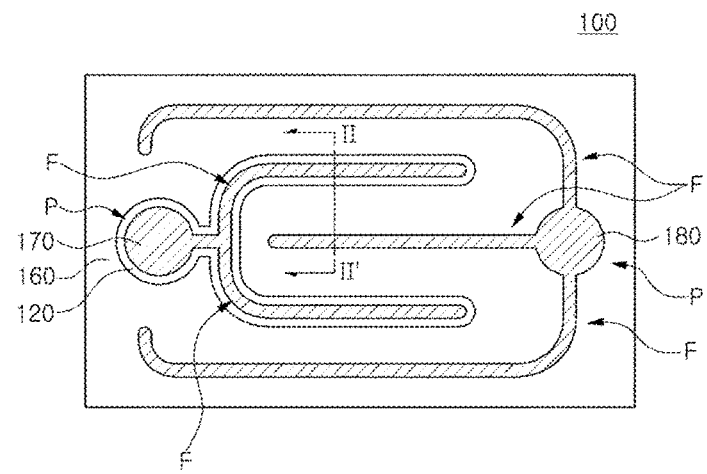
FIG. 1 is a plan view schematically illustrating a semiconductor light emitting device according to an example embodiment of the present disclosure.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a plan view schematically illustrating a semiconductor light emitting device according to an example embodiment of the present disclosure.

Figure 2:
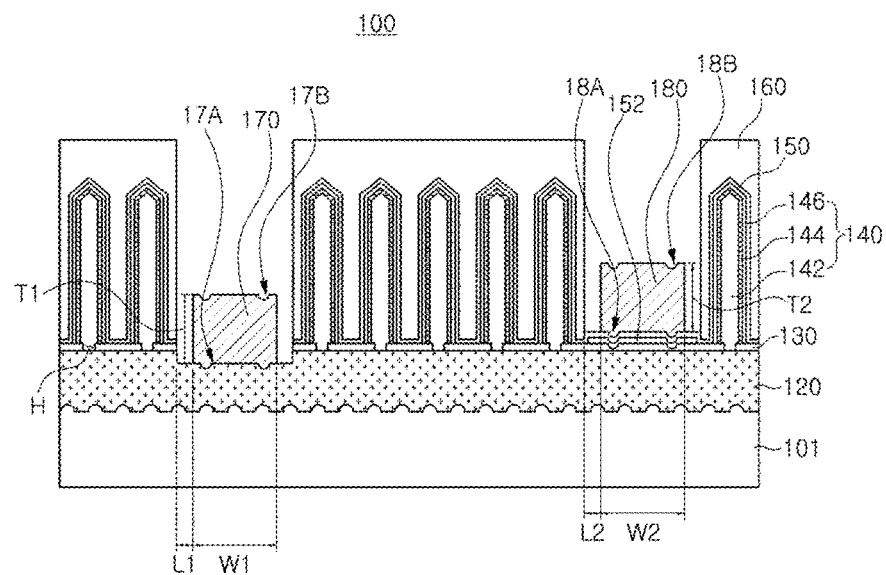
FIG. 2 is a cross-sectional view schematically illustrating a semiconductor light emitting device according to an example embodiment of the present disclosure.

FIG. 2 is a cross-sectional view schematically illustrating a semiconductor light emitting device according to an example embodiment of the present disclosure. Specifically, FIG. 2 is an enlarged cross-sectional view of a semiconductor light emitting device taken along line II-II' of FIG. 1, and here, a predetermined and/or desired number of light emitting nanostructures 140 is selectively illustrated for the purposes of description.

Referring to FIGS. 1 and 2, a semiconductor light emitting device 100 includes a substrate 101, and a base layer 120, a mask layer 130, light emitting nanostructures 140, a transparent electrode layer 150, an electrode insulating layer 152, and/or a filler layer 160 formed on the substrate 101. Each of the light emitting nanostructures 140 includes a first conductivity-type semiconductor core 142, an active layer 144, and a second conductivity-type semiconductor layer 146 grown from the base layer 120 of a first conductivity-type semiconductor. The semiconductor light emitting device 100 may further include first and second electrodes 170 and 180 electrically connected to the base layer 120 and the second conductivity-type semiconductor layer 146, respectively.

In the present disclosure, unless otherwise mentioned, terms such as 'upper portion', 'upper surface', 'lower portion', 'lower surface', 'lateral surface', and the like, are determined based on the drawings, and in actuality, the terms may be changed according to a direction in which a device is disposed.

The substrate 101 may be provided as a semiconductor growth substrate and may be formed of an insulating, a conductive, or a semiconductive material such as sapphire, SiC, $MgAl_2O_4$, MgO, $LiAlO_2$, $LiGaO_2$, GaN, or the like. A sapphire substrate is a crystal having Hexa-Rhombo R3c symmetry, of which lattice constants in c-axial and a-axial directions are approximately 13.001 Å and 4.758 Å, respectively, and has a c-plane (0001), an a-plane (11-20), an r-plane (1-102), and the like. In this case, the C-plane of sapphire crystal allows a nitride thin film to be relatively easily grown thereon and is stable at higher temperatures, so the sapphire substrate is commonly used as a nitride growth substrate. Meanwhile, in a case in which the substrate 101 is formed of silicon (Si), it may be more appropriate for increasing a diameter and is relatively low in price, facilitating mass-production.

A depression and protrusion pattern may be formed on a surface of the substrate 101 to enhance light extraction efficiency. However, a shape of the depression and protrusion pattern is not limited to that illustrated in the drawing. In an example embodiment, a buffer layer may further be disposed on the substrate 101 in order to enhance crystallinity of the first conductivity-type semiconductor base layer 120. The buffer layer may be formed of, for example, aluminum gallium nitride $Al_xGa_{1-x}N$ grown at a lower temperature without being doped.

In an example embodiment, the substrate 101 may be removed to be omitted. For example, in a case in which the semiconductor light emitting device 100 is mounted on an external device such as a package board in a flipchip manner, the substrate 101 may be omitted, and even in the case that silicon (Si) is used as a material of the substrate 101, the substrate 101 may be omitted in a follow-up process.

The base layer 120 may be disposed on the substrate 101. The base layer 120 may be formed of a Group III-V compound, for example, gallium nitride GaN. The base layer 120 may be, for example, n-type gallium nitride n-GaN doped with an n-type impurity.

In the present example embodiment, the base layer 120 may be commonly connected to at least one side of the light emitting nanostructures 140 to serve as a contact electrode, as well as providing crystal planes for growth of the first conductivity-type semiconductor core 142.

The mask layer 130 is disposed on the base layer 120. The mask layer 130 may be formed of a silicon oxide or a silicon nitride. For example, the mask layer 130 may be formed of at least one among silicon oxide ($SiO_x$), silicon oxynitride ($SiO_xN_y$), silicon nitride ($Si_xN_y$), aluminum oxide ($Al_2O_3$) titanium nitride (TiN), aluminum nitride (AlN), zirconium oxide (ZrO), titanium aluminum nitride (TiAlN), and titanium silicon nitride (TiSiN). For example, the mask layer 130 may be a Distributed Bragg Reflector (DBR) layer or an omni-directional reflector (ODR). In example embodiments, the mask layer 130 may have a structure in which layers having different refractive indices are alternately repeatedly disposed. However, the present disclosure is not limited thereto and, according to an example embodiment, the mask layer 130 may be a monolayer.

The mask layer 130 may include a plurality of openings H exposing portions of the base layer 120. The diameter, length, position, and/or growth conditions of the light emitting nanostructures 140 may be determined depending on the size of the plurality of openings H. The plurality of openings H may have various shapes such as a circular shape, a quadrangular shape, a hexagonal shape, and the like.

The plurality of light emitting nanostructures 140 may be disposed in positions corresponding to the plurality of openings H. The light emitting nanostructures 140 may have a core-shell structure including the first conductivity-type semiconductor core 142 grown from regions of the first conductivity-type semiconductor base layer 120 exposed by the plurality of openings H, and the active layer 144 and the second conductivity-type semiconductor layer 146 sequentially formed on a surface of the first conductivity-type semiconductor core 142. As illustrated, the width of the first conductivity-type semiconductor core 142 may be greater than those of the plurality of openings H, but the relative difference in widths is not limited to the illustrated configuration.

The first conductivity-type semiconductor core 142 and the second conductivity-type semiconductor layer 146 may respectively be formed of a semiconductor material doped with an n-type impurity and a semiconductor doped with a p-type impurity, but the present disclosure is not limited thereto and, conversely, the first conductivity-type semiconductor core 142 and the second conductivity-type semiconductor layer 146 may also respectively be formed of p-type and n-type semiconductor materials. The first conductivity-type semiconductor core 142 and the second conductivity-type semiconductor layer 146 may be formed of a nitride semiconductor, e.g., an aluminum indium gallium nitride having a composition of $Al_xIn_yGa_{1-x-y}N$ ($0 \le x \le 1$, $0 \le y \le 1$, $0 \le x+y \le 1$), and each of the semiconductor layers 142 and 146 may be configured as a single layer, or may include a plurality of layers having different characteristics such as different doping concentrations, compositions, and the like. In example embodiments, the first conductivity-type semiconductor core 142 and the second conductivity-type semiconductor layer 146 may be formed of an aluminum indium gallium phosphide (AlInGaP) or aluminum indium gallium arsenide (AlInGaAs) semiconductor, besides a nitride semiconductor. In the present example embodiment, the first conductivity-type semiconductor core 142 may be formed of an n-type gallium nitride (n-GaN) doped with silicon (Si) or carbon (C), and the second conductivity-type semiconductor layer 146 may be formed of a p-type gallium nitride (p-GaN) doped with magnesium (Mg) or zinc (Zn), for example.

The active layer 144 may be disposed on a surface of the first conductivity-type semiconductor core 142. The active layer 144 may be a layer emitting light having a predetermined and/or desired level of energy according to electron-hole recombination and formed of a single material such as indium gallium nitride (InGaN), or the like, or may have a multi-quantum well (MQW) structure in which quantum barrier layers and quantum well layers are alternately disposed, and, for example, in case of a nitride semiconductor, a gallium nitride (GaN)/indium gallium nitride (InGaN) structure may be used. In the case in which the active layer 144 includes indium gallium nitride (InGaN), crystal defects due to lattice mismatches may be reduced and internal quantum efficiency of the semiconductor light emitting device 100 may be increased by increasing the content of indium (In). Also, an emission wavelength may be adjusted according to the content of indium (In).

The number of light emitting nanostructures 140 included in the semiconductor light emitting device 100 may not be limited to that illustrated in the drawings and the semiconductor light emitting device 100 may include, for example, tens to millions of light emitting nanostructures 140. The plurality of light emitting nanostructures 140 may be arranged to have a hexagonal shape in which one light emitting nanostructure 140 is surrounded by six light emitting nanostructures 140 on a plane, but the present disclosure is not limited to such an arrangement.

In the present example embodiment, each of the light emitting nanostructures 140 may have a lower hexagonal prism region and an upper hexagonal pyramid region. In example embodiments, the first conductivity-type semiconductor core 142 may have lower m planes and upper r planes as different crystal planes. The active layer 144 and the second conductivity-type semiconductor layer 146 formed on upper portions of the m planes and the r planes may have different thicknesses according to the crystal planes. For example, the active layer 144 and the second conductivity-type semiconductor layer 146 formed on the m planes may be thicker than the active layer 144 and the second conductivity-type semiconductor layer 146 formed on the r planes. Also, in an example embodiment, the light emitting nanostructures 140 may have a pyramid shape or a prism shape. Since the light emitting nanostructures 140 have such a three-dimensional (3D) shape, they have a relatively large light emission area, and thus, luminous efficiency may be increased.

The transparent electrode layer 150 may be electrically connected to the second conductivity-type semiconductor layer 146. The transparent electrode layer 150 may cover upper surfaces and lateral surfaces of the light emitting nanostructures 140 and may be connected between adjacent light emitting nanostructures 140. The transparent electrode layer 150 may be formed of, for example, indium tin oxide (ITO), aluminum zinc oxide (AZO), indium zinc oxide (IZO), zinc oxide (ZnO), GZO (ZnO:Ga), indium oxide ($In_2O_3$), tin oxide ($SnO_2$), cadmium oxide (CdO), cadmium tin oxide ($CdSnO_4$), or gallium oxide ($Ga_2O_3$).

The filler layer 160 may be disposed on the light emitting nanostructures 140 and the transparent electrode layer 150. The filler layer 160 may fill spaces between adjacent light emitting nanostructures 140 and may be disposed to cover the light emitting nanostructures 140 and the transparent electrode layer 150 on the light emitting nanostructures 140. According to an example embodiment, an upper surface of the filler layer 160 may be formed to be uneven along the light emitting nanostructures 140.

The filler layer 160 may be formed of a light-transmissive insulating material and include, for example, silicon dioxide ($SiO_2$), silicon nitride ($SiN_x$), aluminum oxide ($Al_2O_3$), hafnium oxide (HfO), titanium oxide ($TiO_2$), or zirconium oxide (ZrO). However, in an example embodiment, the filler layer 160 may include a conductive material. In this case, the filler layer 160 may be formed to be electrically connected to the second electrode 180 or may be integrally formed with the second electrode 180. The semiconductor light emitting device 100 may be mounted in a flipchip structure such that the first and second electrodes 170 and 180 face an external board such as a package board. Also, in an example embodiment, the filler layer 160 may include air.

In an example embodiment, a passivation layer may be disposed on the filler layer 160. The passivation layer may be disposed to expose upper surfaces of the first and second electrodes 170 and 180.

The first and second electrodes 170 and 180 may be disposed on the base layer 120 and the transparent electrode layer 150 on one sides of the semiconductor light emitting device 100, respectively, so as to be electrically connected to the base layer 120 and the second conductivity-type semiconductor layer 146, respectively. The first and second electrodes 170 and 180 may be disposed in the same direction with respect to the substrate 101.

Also, as illustrated in FIG. 1, the first and second electrodes 170 and 180 may include pad portions P and finger portions F extending from the pad portions P and having a width narrower than that of the pad portions P in order to allow a current to be evenly applied to the entirety of the plurality of light emitting nanostructures 140. The pad portions P may be a region in contact with a conductive wire, a solder bump, or the like. Also, the finger portions F of the first electrode 170 and the finger portions F of the second electrode 180 may be disposed to alternately miss each other (or to alternately diverge from one another). Due to such a layout of the first and second electrodes 170 and 180, a current may effectively flow within the light emitting nanostructures 140, increasing luminous efficiency. However, the illustrated layout or configuration of the first and second electrodes 170 and 180 are merely illustrative and relative dispositions of the pad portions P and the finger portions F, the number of the finger portions F, or the like, may be variously modified according to an example embodiment. Also, in an example embodiment, the first and second electrodes 170 and 180 may not have the finger portions F.

The first and second electrodes 170 and 180 may be formed as a monolayer of a conductive material or may have a multilayer structure of a conductive material. For example, the first and second electrodes 170 and 180 may include one or more among gold (Au), silver (Ag), copper (Cu), zinc (Zn, aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), and alloys thereof.

The first and second electrodes 170 and 180 may have first pattern portions 17A and 18A formed on lower surfaces thereof and second pattern portions 17B and 18B formed on upper surfaces thereof, respectively. The first and second pattern portions 17A, 18A, 17B, and 18B may be positioned to have the same arrangement as that of the plurality of light emitting nanostructures 140, and may have a shape corresponding to the plurality of openings H on a plane. This will be described in detail with reference to FIG. 5. In an example embodiment, the first and second electrodes 170 and 180 may have first pattern portions 17A and 18A formed on lower surfaces thereof and second pattern portions 17B and 18B formed on upper surfaces thereof, respectively. The second pattern portions 17B and 18B may be less uneven than the first pattern portions 17A and 18A or may have a flat surface.

The first electrode 170 may be disposed in the region in which the base layer 120 is recessed. The first pattern portion 17A of the first electrode 17 may be protruded toward the base layer 120, while having a convex shape, and the second pattern portion 17B may be depressed from an upper surface of the first electrode 170, while having a concave shape. The base layer 120 may have an uneven surface corresponding to the first pattern portion 17A in the recessed region thereof. In an example embodiment, the first electrode 170 may be formed on the base layer 120 which is not recessed.

The first electrode 170 may have a first width W1, and the recessed base layer 120 may be exposed by a first distance L1 on sides of the first electrode 170. The first width W1 may be greater than the first distance L1, but relative sizes of the first width W1 and the first distance L1 are not limited to those illustrated in the drawing and may be variously modified. Also, the first electrode 170 may have a first thickness T1 from an upper surface of the recessed base layer 120, and an upper surface of the first electrode 170 may be lower than the light emitting nanostructures 140. However, when the semiconductor light emitting device is mounted in a flipchip manner, the upper surface of the first electrode 170 may be positioned to be higher than the light emitting nanostructures 140.

The second electrode 180 may be disposed on the transparent electrode layer 150. Also, the mask layer 130 and the electrode insulating layer 152 may be further disposed between the second electrode 180 and the base layer 120. The second electrode 180 may be electrically insulated from the lower base layer 120 due to the electrode insulating layer 152. The first pattern portion 18A of the second electrode 180 may protrude toward the transparent electrode layer 150, having a convex shape. The second pattern portion 18B may be depressed downwardly from the upper surface of the second electrode 180, having a concave shape. The transparent electrode layer 150, the mask layer 130, and the electrode insulating layer 152 may have uneven surfaces corresponding to the first pattern portion 18A in the region including the lower portion of the second electrode 180, in which the filler layer 160 is not disposed. Also, in an example embodiment, the lower base layer 120 may have an uneven surface corresponding to the first pattern portion 18A.

The second electrode 180 may have a second width W2, and sides of the second electrode 180 may be spaced apart from the filler layer 160 by a second distance L2. The second width W2 may be equal to or similar to the first width W1 of the first electrode 170, and may be greater than the second distance L2 but relative sizes of the second width W2 and the second distance L2 are not limited to those illustrated in the drawing and may be variously modified. Also, the second electrode 180 may have a second thickness T2 from an upper surface of the depressed transparent electrode layer 150. The second thickness T2 may be equal to or similar to the first thickness T1 of the first electrode layer 170, and an upper surface of the second electrode 180 may be lower than the light emitting nanostructures 140. However, when the semiconductor light emitting device is mounted in a flipchip manner, the upper surface of the second electrode 180 may be positioned to be higher than the light emitting nanostructures 140.

FIGS. 3A through 3L are cross-sectional views schematically illustrating a method of manufacturing a semiconductor light emitting device according to an example embodiment of the present disclosure. FIGS. 3A through 3L illustrate cross-sectional views corresponding to the cross-sectional view of FIG. 2.

Figure 3A:
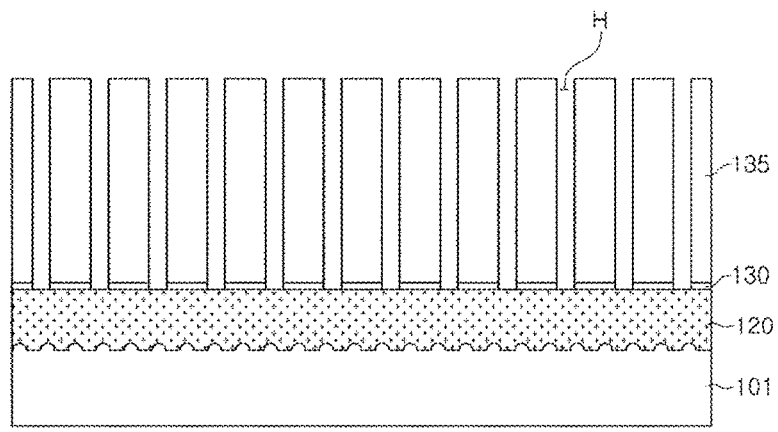
FIGS. 3A through 3L are cross-sectional views schematically illustrating a method of manufacturing a semiconductor light emitting device according to an example embodiment of the present disclosure.

Referring to FIG. 3A, the base layer 120, the mask layer 130, and a mold layer 135 may be formed on the substrate 101.

First, a depression and protrusion pattern may be formed on an upper surface of the substrate 101 and a first conductivity-type semiconductor may be grown on the substrate 101 to form the base layer 120. The base layer 120 may provide a crystal growth surface allowing the light emitting nanostructures 140 (refer to FIG. 2) to grow thereon, and may be a structure electrically connecting one sides of the light emitting nanostructures 140. Thus, the base layer 120 may be formed as a semiconductor single crystal having electrical conductivity, and in this case, the substrate 101 may be a substrate for crystal growth.

Subsequently, the mask layer 130 and the mold layer 135 having a plurality of openings H exposing the base layer 120 may be formed on the base layer 120. A material for forming the mask layer 130 and a material for forming the mold layer 135 may be sequentially deposited and patterned using a mask pattern to form the plurality of openings H, thus forming the mask layer 130 and the mold layer 135. In an example embodiment, the plurality of openings H may have a cylindrical shape having a downwardly reduced diameter, and thus, lateral surfaces of the plurality of openings H may have a predetermined and/or desired slope angle with respect to an upper surface of the substrate 101. The sum of thicknesses of the mask layer 130 and the mold layer 135 may be designed in consideration of an intended height of the light emitting nanostructures 140 (refer to FIG. 1). Also, a size of the plurality openings H may be designed in consideration of an intended size of the light emitting nanostructures 140.

The mask layer 130 and the mold layer 135 may be formed of materials having different etching rates under particular etching conditions, and may also be formed of materials having different etching rates from that of the base layer 120. Thus, an etching process may be controlled when the plurality of openings H are formed. For example, the mask layer 130 is formed of silicon nitride (SiN), and the mold layer 135 is formed of a silicon dioxide ($SiO_2$).

Figure 3B:
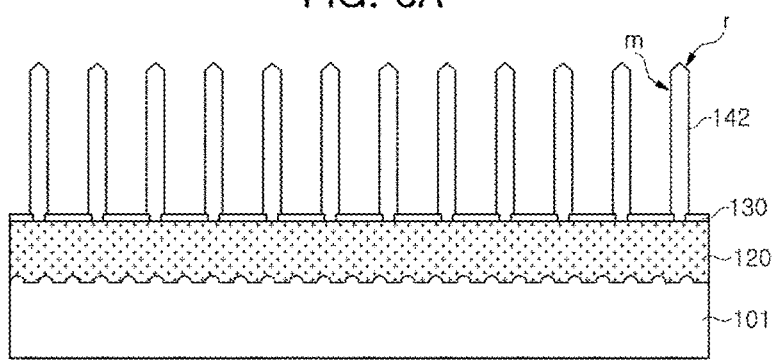

Referring to FIG. 3B, a first conductivity-type semiconductor may be grown on the base layer 120 exposed by the plurality of openings H to form a plurality of first conductivity-type semiconductor cores 142.

The first conductivity-type semiconductor cores 142 may be formed of, for example, an n-type nitride semiconductor, and may be formed of a material identical to that of the first conductivity-type semiconductor base layer 120. The first conductivity-type semiconductor core 142 may be formed using metal-organic chemical vapor deposition (MOCVD) or molecular beam epitaxy (MBE).

Subsequently, the mold layer 135 may be selectively removed with respect to the mask layer 130 and the first conductivity-type semiconductor cores 142. The removing of the mold layer 135 may be performed by a wet etching process, for example. The remaining mask layer 130 may serve to prevent the active layer 144 and the second conductivity-type semiconductor layer 146 from being connected to the first conductivity-type semiconductor base layer 120 in a follow-up process.

After the mold layer 135 is removed, a re-growth process may be performed to convert crystal planes of the first conductivity-type semiconductor cores 142 into stable planes advantageous to crystal growth, such as semi-polar r planes or non-polar m planes. Accordingly, the width of the first conductivity-type semiconductor cores 142 may be greater than that of the openings H, and crystallinity of the first conductivity-type semiconductor cores 142 may be increased. However, this process may be omitted in consideration of the shape of the openings H and a growth shape of the first conductivity-type semiconductor cores 142 based on the shape of the openings H.

Figure 3C:
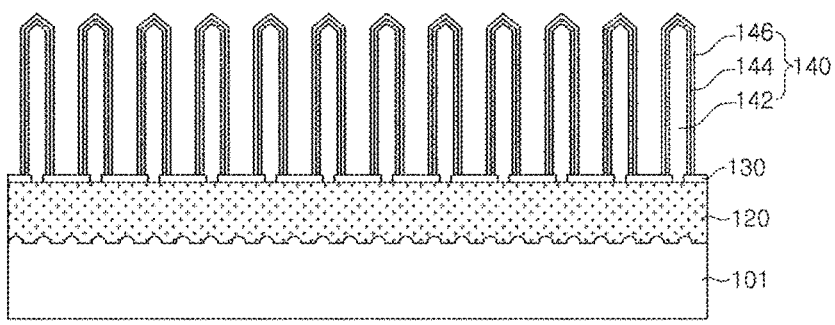

Referring to FIG. 3C, the active layer 144 and the second conductivity-type semiconductor layer 146 may be formed on surfaces of the first conductivity-type semiconductor cores 142.

During this process, light emitting nanostructures 140 having a core-shell structure may be formed. As described above, the active layer 144 and the second conductivity type semiconductor layers 146 may have different thicknesses on the m planes and r planes of the first conductivity-type semiconductor cores 142 according to a deposition method. For example, the active layer 144 and the second conductivity type semiconductor layers 146 may be thicker on the m planes than on the r planes.

In an example embodiment, an electric charge blocking layer may be formed on the active layer 144. Also, in an example embodiment, the active layer 144 may not be disposed on a sloped surface of the upper end portion of each of the first conductivity-type semiconductor cores 142, and the electric charge blocking layer may be disposed instead. The electric charge blocking layer may serve to prevent electric charges injected from the first conductivity-type semiconductor core 142 from being transferred to the second conductivity-type semiconductor layer 146, rather than being used for electron-hole recombination in the active layer 144. The electric charge blocking layer may include a material having band gap energy greater than that of the active layer 144. For example, the electric charge blocking layer may include aluminum gallium nitride (AlGaN) or aluminum indium gallium nitride (AlInGaN).

Figure 3D:
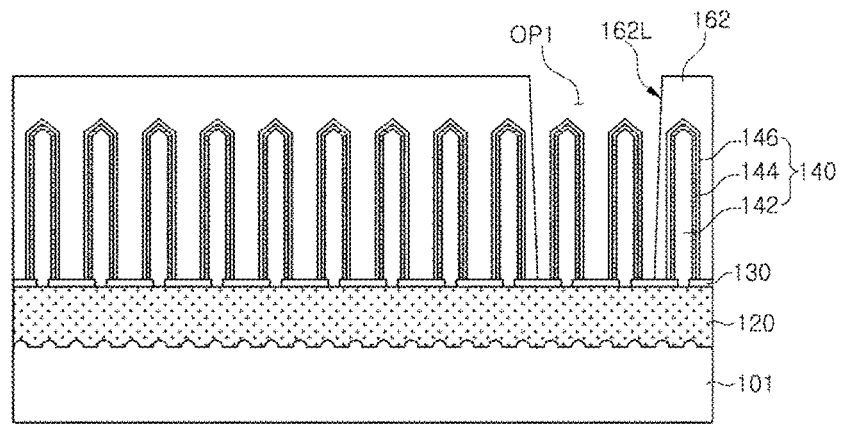

Referring to FIG. 3D, a first filler layer 162 having first openings OP1 may be formed on the second conductivity-type semiconductor layer 146 and 130.

The first filler layer 162 may be formed of a material having etching selectivity with respect to the base layer 120, the mask layer 130, and the light emitting nanostructures 140. For example, the first filler layer 162 may include a silicon dioxide ($SiO_2$). Also, the first filler layer 162 may be any one among tetra ethyl ortho silicate (TEOS), a high temperature oxide (HTO), a high density plasma (HDP) oxide, boro-phospho-silicate (BPSG) glass, and undoped silicate glass (USG).

The first opening OP1 may be formed by depositing a first filler layer 162 material and subsequently removing a portion of the first filler layer 162 using a mask, and may expose the light emitting nanostructures 140 in a region in which the second electrode 180 (refer to FIGS. 1 and 2) is to be formed. A side wall 162L of the first filler layer 162 in which the first opening OP1 is formed may be sloped with respect to an upper surface of the base layer 120, but the present disclosure is not limited thereto.

Figure 3E:
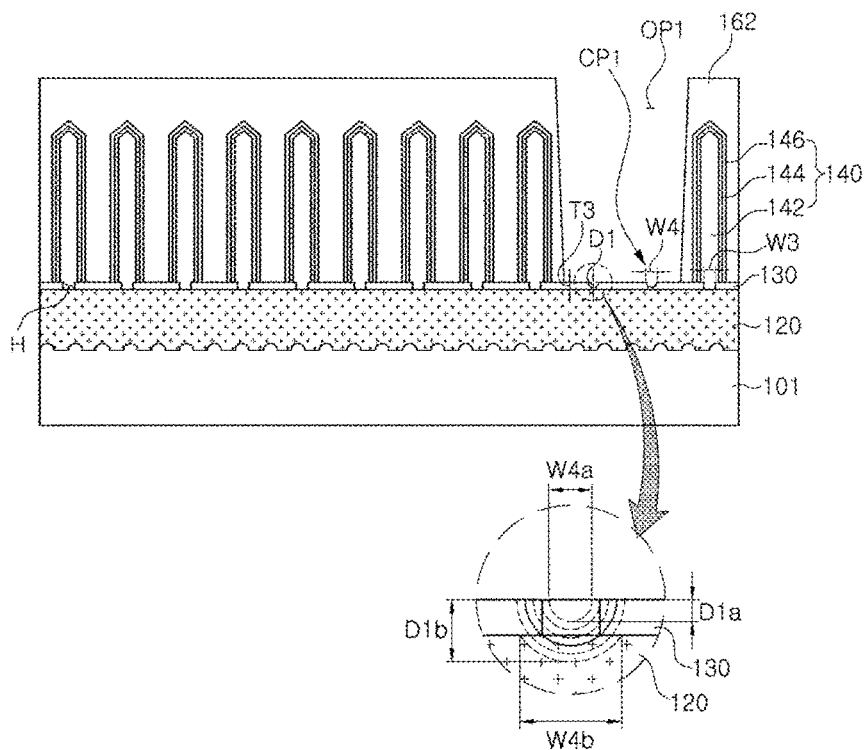

Referring to FIG. 3E, the light emitting nanostructure 140 exposed by the first opening OP1 may be removed.

The exposed light emitting nanostructures 140 may be removed by using ultrasonic waves or by jetting a liquid or a solid at a high pressure for the removal thereof, or may be removed through dry etching or wet etching. This will be described in more detail with reference to FIGS. 4A through 4C.

A first concave portion CP1 may be formed in a lower portion of each of the light emitting nanostructures 140 which have been removed. The first concave portion CP1 may be formed in a cut surface when each of the light emitting nanostructures 140 is removed. The first concave portion CP1 may be formed as each of the light emitting nanostructures 140 is not cut accurately in the interface between the base layer 120 and the first conductivity-type semiconductor core 142. For example, the first concave portion CP1 may be formed as a portion of the first conductivity-type semiconductor core 142, remaining when each of the light emitting nanostructures 140 has been removed, or as a portion of the mask layer 130 on the circumference of the light emitting nanostructure 140 and a portion of the lower base layer 120 are removed together when each of the light emitting nanostructures 140 is removed. In the present example embodiment, it is illustrated that the first concave portion CP1 is formed on the circumference of each of the removed light emitting nanostructures 140, but the present disclosure is not limited thereto and the first concave portion CP1 may be defined by at least one among the first conductivity-type semiconductor core 142, the mask layer 130, and the base layer 120 remaining within the opening H.

As illustrated in the enlarged view, a width W4 of the first concave portion CP1 may be greater than or smaller than a width W3 of the opening H of the mask layer 130 within a predetermined and/or desired range from W4a to W4b. Also, a depth D1 of the first concave portion CP1 may be greater or smaller than a thickness T3 of the mask layer 130 within a predetermined and/or desired range D1a to D1b.

Figure 3F:
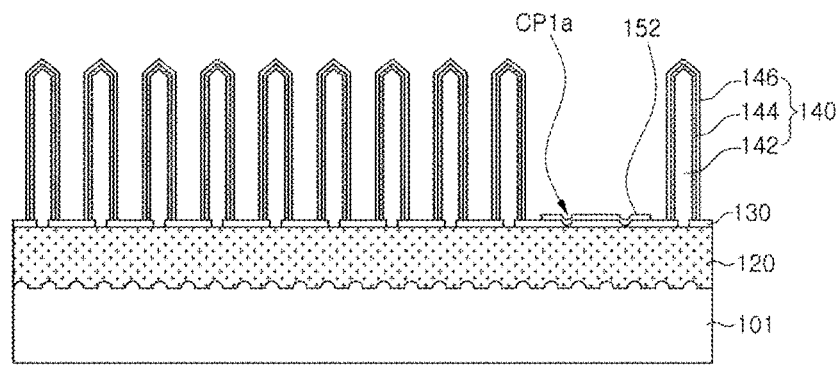

Referring to FIG. 3F, the electrode insulating layer 152 may be formed on the base layer 120 exposed in the region from which the light emitting nanostructures 140 were removed.

The electrode insulating layer 152 may be conformally formed on the mask layer 130 with the first concave portion CP1 formed thereon, and thus, a concave portion CP1a may be formed on the electrode insulating layer 152. The concave portion CP1a may have a depth equal to or shallower than that of the first concave portion CP1.

The electrode insulating layer 152 may be formed of an insulating material and may include, for example, a silicon dioxide ($SiO_2$). The electrode insulating layer 152 may be formed to electrically insulate the exposed base layer 120 from the transparent electrode layer 150 and the second electrode 180 (refer to FIGS. 1 and 2) formed in a follow-up process. In an example embodiment, in a case in which a portion of the first conductivity-type semiconductor core 142 remains, the electrode insulating layer 152 may electrically insulate the first conductivity-type semiconductor core 142 from the transparent electrode layer 150 and the second electrode 180.

First, the first filler layer 162 may be removed and the electrode insulating layer 152 may be formed in a region corresponding to the first opening OP1. The region in which the electrode insulating layer 152 is formed may be variously modified within a range in which the lower base layer 120 is not exposed, and in an example embodiment, the electrode insulating layer 152 may be formed to be in contact with an adjacent light emitting nanostructure 140. Also, in an example embodiment, when the electrode insulating layer 152 is formed of a material having etching selectivity with respect to the first filler layer 162, the electrode insulating layer 152 may be formed using the first filler layer 162 as a mask, rather than removing the first filler layer 162.

Figure 3G:
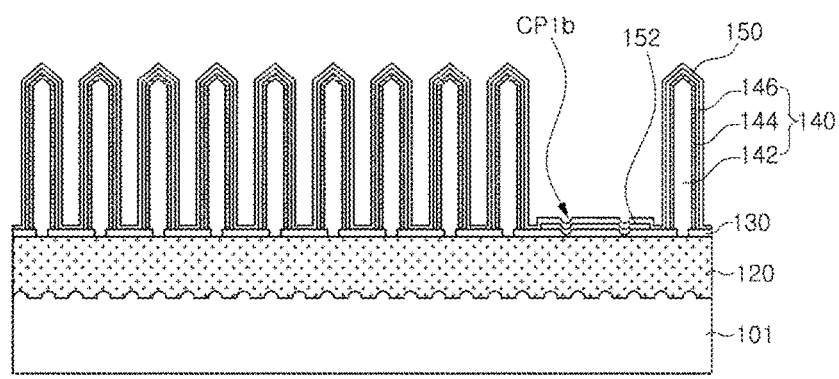

Referring to FIG. 3G, the transparent electrode layer 150 may be formed on the second conductivity-type semiconductor layer 146 and the electrode insulating layer 152.

The transparent electrode layer 150 may cover an upper surface of the mask layer 130 between adjacent light emitting nanostructures 140 and extend to the surface of the electrode insulating layer 152 in the region corresponding to the first opening OP1 so as to be formed as a single layer.

A concave portion CP1b may be formed on the transparent electrode layer 150 such that it corresponds to the concave portion CP1a of the electrode insulating layer 152. The concave portion CP1b of the transparent electrode layer 150 may have a depth equal to or shallower than that of the concave portion CP1a of the electrode insulating layer 152.

Figure 3H:
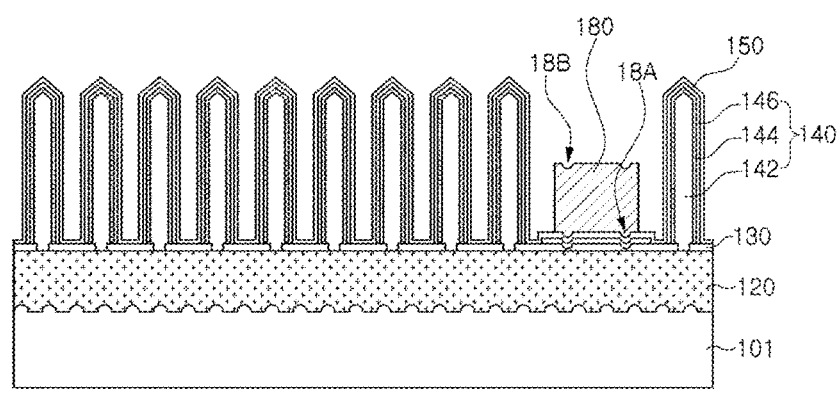

Referring to FIG. 3H, the second electrode 180 may be formed on the electrode insulating layer 152.

The second electrode 180 may be formed on only the electrode insulating layer 152 using a mask, and may be formed through a lift-off process. The second electrode 180 may have a first pattern portion 18A formed on a lower surface thereof corresponding to the concave portion CP1b of the transparent electrode layer 150, and a second pattern portion 18B formed on an upper surface thereof corresponding to the first pattern portion 18A. Here, the second pattern portion 18B may be less uneven than the first pattern portion 18A or the second pattern portion 18B may be formed as a flat surface, according to the thickness, material, and process conditions, or the like, of the second electrode 180.

The process of forming the second electrode 180 has been described with reference to FIGS. 3D through 3H. Hereinafter, a process of forming the first electrode 170 will be described with reference to FIGS. 3I through 3L. However, the example embodiment of the present disclosure is not limited to the process orders of the first and second electrodes 170 and 180. For example, in an example embodiment, the first electrode 170 may first be formed and the second electrode 180 may subsequently be formed.

Figure 3I:
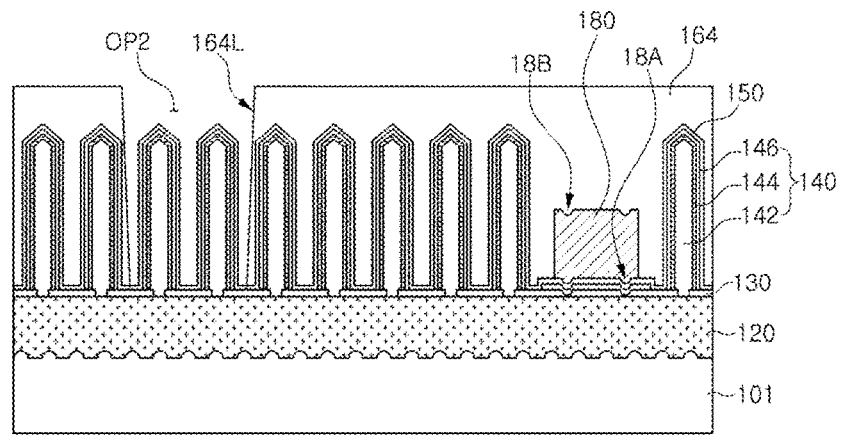

Referring to FIG. 3I, a second filler layer 164 having a second opening OP2 may be formed on the plurality of light emitting nanostructures 140.

The second filler layer 164 may be formed of a material having etching selectivity with respect to the base layer 120, the mask layer 130, and the light emitting nanostructures 140. For example, the second filler layer 164 may be formed of an insulating material and may include, for example, a silicon dioxide ($SiO_2$).

The second opening OP2 may be formed to expose the light emitting nanostructures 140 in the region in which the second electrode 170 (refer to FIGS. 1 and 2) is to be formed. The second opening OP2 may be formed by depositing a second filler layer 164 material and subsequently removing a portion of the second filler layer 164 material using a mask. Also, in an example embodiment, the second filler layer 164 may be a mask used to form the second electrode 180 during the process described above with reference to FIG. 3H.

A side wall 164L of the second filler layer 164 where the second opening OP2 is formed may be sloped with respect to an upper surface of the base layer 120, but the present disclosure is not limited thereto.

Figure 3J:
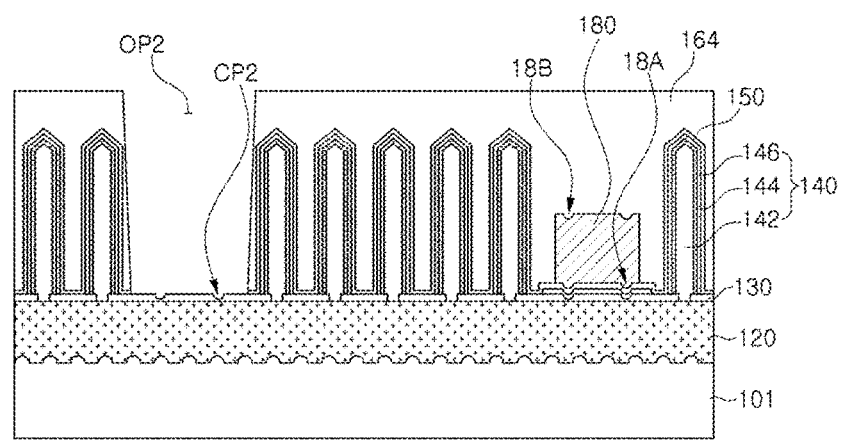

Referring to FIG. 3J, the light emitting nanostructures 140 exposed by the second opening OP2 may be removed.

As described above with reference to FIG. 3E, the exposed light emitting nanostructures 140 may be removed by removing them by using ultrasonic waves or by jetting a liquid or a solid at a high pressure for the removal thereof, or may be removed through dry etching or wet etching.

A second concave portion CP2 may be formed in a lower portion of each of the light emitting nanostructures 140 which have been removed. The second concave portion CP2 may be formed in a cut surface when each of the light emitting nanostructures 140 is removed. The second concave portion CP2 may be formed as each of the light emitting nanostructures 140 is not cut accurately in the interface between the base layer 120 and the first conductivity-type semiconductor core 142. For example, the second concave portion CP2 may be formed as a portion of the first conductivity-type semiconductor core 142, remaining when each of the light emitting nanostructures 140 has been removed, or as a portion of the mask layer 130 on the circumference of the light emitting nanostructure 140 and a portion of the lower base layer 120 are removed together when each of the light emitting nanostructures 140 is removed. In the present example embodiment, it is illustrated that the second concave portion CP2 is formed on the circumference of each of the removed light emitting nanostructures 140, but the present disclosure is not limited thereto and the second concave portion CP2 may be defined by at least one among the first conductivity-type semiconductor core 142, the mask layer 130, and the base layer 120 remaining within the opening H.

Like the first concave portion CP1 described above with reference to FIG. 3E, a width and a depth of the second concave portion CP2 may also be variously modified according to example embodiments.

Figure 3K:
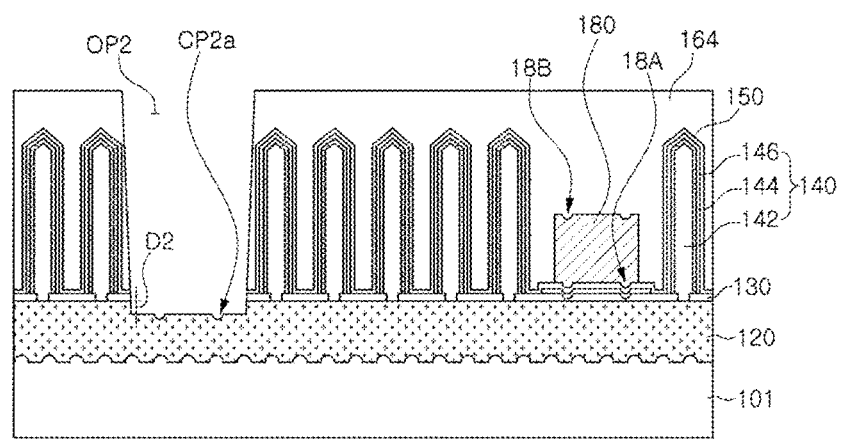

Referring to FIG. 3K, a portion of the base layer 120 within the second opening OP2 may be removed.

The base layer 120 may be removed, for example, through an etching process, and during the etching process, the mask layer 130 within the second opening OP2 may also be removed. A depth D2 of a recess formed as the base layer 120 is partially removed may be variously modified according to example embodiments.

In a case in which the mask layer 130 and the base layer 120 have the same or similar etching rate with respect to an etchant, a concave portion CP2a corresponding to the second concave portion CP2 may be formed on the exposed base layer 120. The concave portion CP2a of the base layer 120 may have a depth equal to or shallower than that of the second concave portion CP2.

Figure 3L:
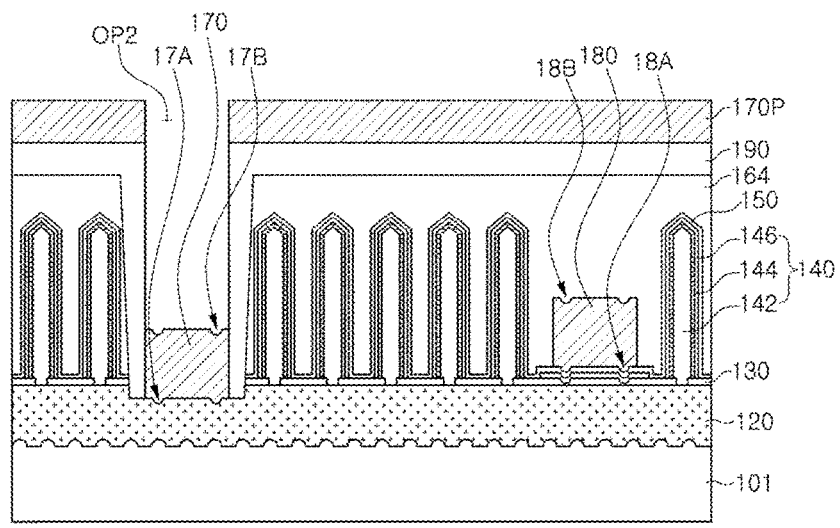

Referring to FIG. 3L, the first electrode 170 may be formed on the recessed base layer 120.

After the deposited and recessed base layer 120 is exposed using a photomask layer 190, the electrode material 170P for forming the first electrode 170 may be deposited on the entirety. Thereafter, the photomask layer 190 is removed to remove the electrode material 170P on the photomask layer 190 together. Through this lift-off process, the first electrode 170 may be formed on only the recessed base layer 120. The first electrode 170 may have the first pattern portion 17A formed on a lower surface thereof corresponding to the concave portion CP2a, and the second pattern portion 17B formed on an upper surface thereof corresponding to the first pattern part 17A. Here, the second pattern portion 17B may be less uneven than the first pattern portion 17A or the second pattern portion 17B may be formed as a flat surface, according to the thickness, material, and process conditions, or the like, of the first electrode 170.

Next, referring to FIG. 2 together, the photomask layer 190 may be removed, and a portion of the second filler layer 164 may be removed to form the filler layer 160 exposing the second electrode 180. In an example embodiment, the filler layer 160 may be formed of air. Namely, the filler layer 164 may be entirely removed.

Figure 4A:
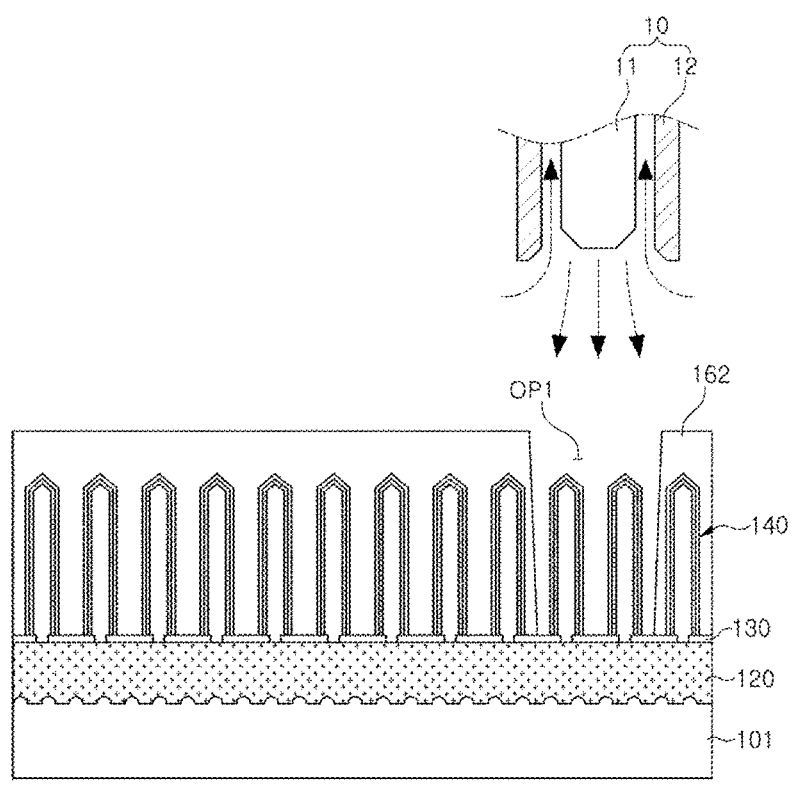
FIGS. 4A through 4C are cross-sectional views schematically illustrating a method of manufacturing a semiconductor light emitting device according to an example embodiment of the present disclosure.
Figure 4B:
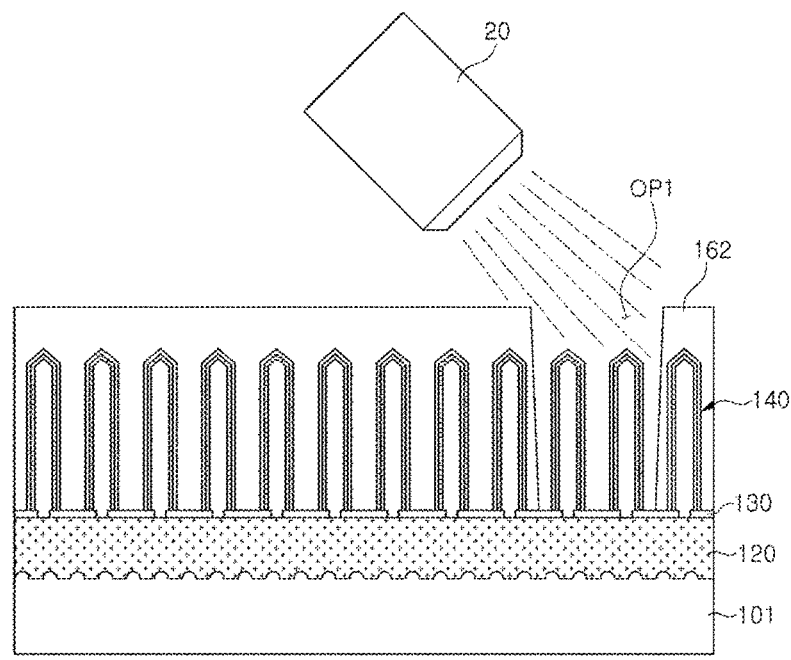
Figure 4C:
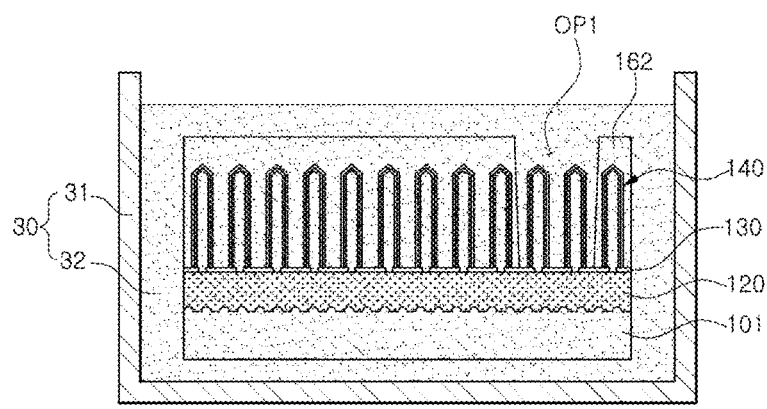

FIGS. 4A through 4C are cross-sectional views schematically illustrating a method of manufacturing a semiconductor light emitting device according to an example embodiment of the present disclosure. In FIGS. 4A through 4C, the process of removing the light emitting nanostructures 140 described above with reference to FIG. 3E is specifically illustrated, and the process of removing the light emitting nanostructures 140 described above with reference to FIG. 3J may also be performed in the same manner.

Referring to FIG. 4A, the light emitting nanostructures 140 exposed by the first opening OP1 of the first filler layer 162 may be removed using an ultrasonic device 10.

The ultrasonic device 10 may include an ultrasonic head 11 and an intake cover unit 12. Ultrasonic waves having a predetermined and/or desired frequency generated by the ultrasonic head 11 are radiated toward the substrate 101 therebelow through a medium such as a gas, and the light emitting nanostructures 140 broken by the ultrasonic waves may be drawn into a space between the intake cover unit 12 and the ultrasonic head 11 for the removal thereof. The ultrasonic device 10 of FIG. 4A is merely illustrative and may be a dry cleaning device, and the ultrasonic device used in an example embodiment of the present disclosure is not limited to the device illustrated in FIG. 4A. For example, in an example embodiment, a wet ultrasonic device using a liquid medium may also be used.

Referring to FIG. 4B, the light emitting nanostructures 140 exposed by the first opening OP1 of the first filler layer 162 may be removed using an injection device 20.

The injection device 20 may jet a liquid or a solid at high pressure to break the light emitting nanostructures 140 to remove them. An amount and pressure of a liquid or a solid jetted by the injection device 20 may be selected in consideration of the size and density of the light emitting nanostructures 140.

Referring to FIG. 4C, the light emitting nanostructures 140 exposed by the first opening OP1 of the first filler layer 162 may be removed using wet etching.

An etching device 30 may include an etching bath 31 and an etching solution 32. The substrate 101 on which the light emitting nanostructures 140 are formed may be immersed in the etching solution 32 such that only the exposed light emitting nanostructures 140 are selectively wet-etched. However, such a wet etching device 30 is merely illustrative and, in an example embodiment, a dry etching device may be used.

Figure 5A:
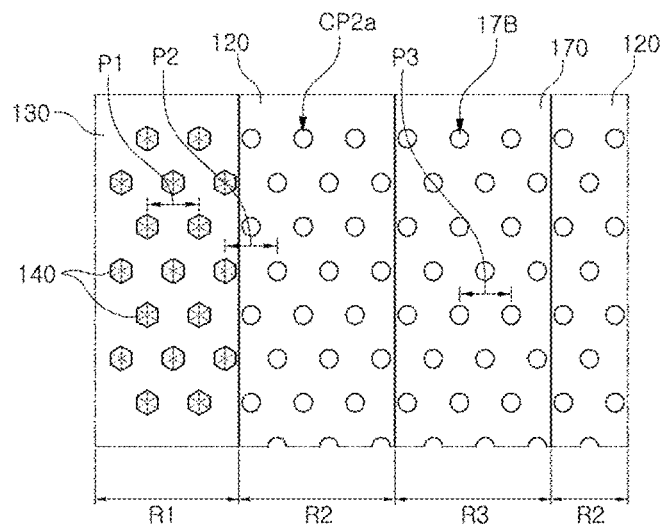
FIGS. 5A and 5B are a plan view and a perspective view schematically illustrating a semiconductor light emitting device according to an example embodiment of the present disclosure.
Figure 5B:
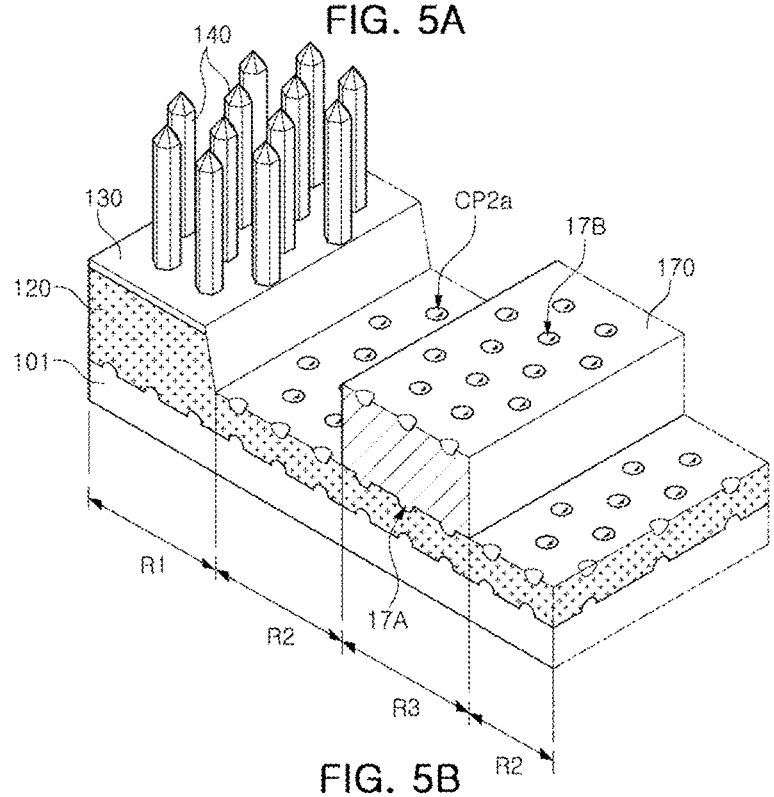

FIGS. 5A and 5B are a plan view and a perspective view schematically illustrating a semiconductor light emitting device according to an example embodiment of the present disclosure. In FIGS. 5A and 5B, a partial region of the semiconductor light emitting device of FIGS. 1 and 2 is specifically illustrated.

Referring to FIGS. 5A and 5B, the semiconductor light emitting device may include first to third regions R1, R2, and R3. The first region R1 may be a light emitting region in which the plurality of light emitting nanostructures 140 are arranged, and the second region R2 may be a region in which the recessed base layer 120 is exposed. The third region R3 may be an electrode region in which the first electrode 170 is positioned.

In the first region R1, the plurality of light emitting nanostructures 140 may be arranged as having a hexagonal shape. The concave portions CP2a and the first and second pattern portions 17A and 17B of the second and third regions R2 and R3 may also be arranged in the same form as that of the plurality of light emitting nanostructures 140 regardless of the shapes on a plane. Thus, in the first to third regions R1, R2, and R3, the light emitting nanostructures 140, the concave portions CP2a, and the first and second pattern portions 17A and 17B may be entirely arranged in a hexagonal shape regularly. This is because the concave portions CP2a and the first and second pattern portions 17A and 17B are formed in positions from which the light emitting nanostructures 140 were removed, as in the method for manufacturing a semiconductor light emitting device described above with reference to FIGS. 3A through 3L. Thus, a distance P1 between the centers of two light emitting nanostructures 140, a distance P2 between the centers of the light emitting nanostructure 140 and the concave portion CP2a, and a distance P3 between the centers of two second pattern portions 17B may all be substantially equal.

In an example embodiment, sizes of the concave portion CP2a and the first and second pattern portions 17A and 17B in the plane parallel to the upper surface of the substrate 101 may be greater than the size of the cross-section of the light emitting nanostructures 140, but the present disclosure is not limited thereto.

Figure 6A:
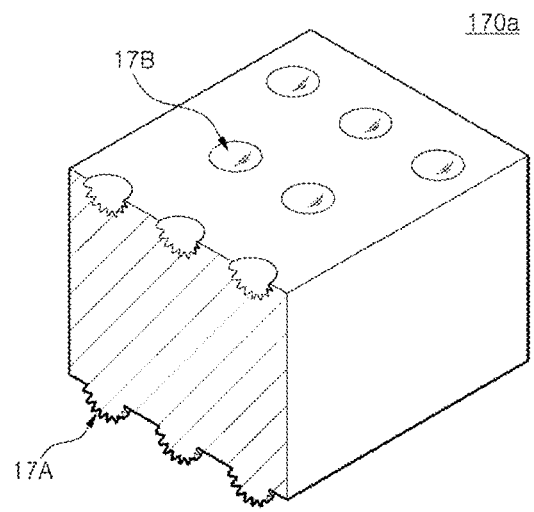
FIGS. 6A through 6C are perspective views schematically illustrating electrodes of a semiconductor light emitting device according to an example embodiment of the present disclosure.
Figure 6B:
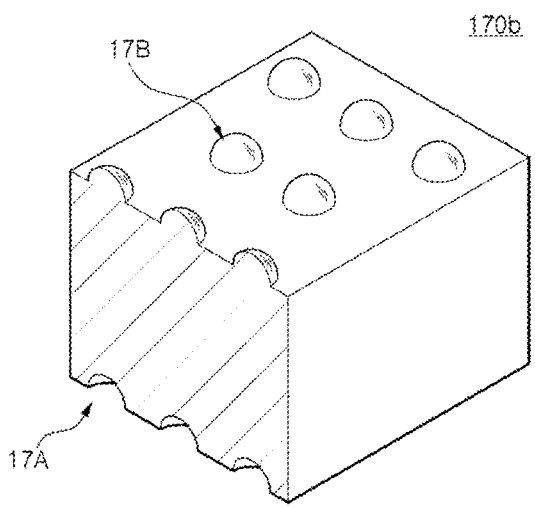
Figure 6C:
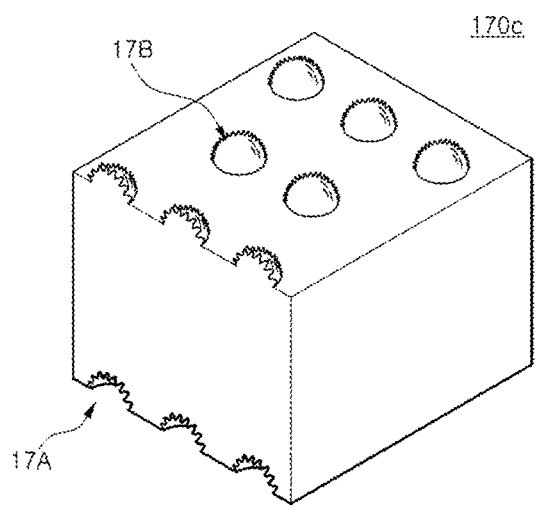

FIGS. 6A through 6C are perspective views schematically illustrating electrodes of a semiconductor light emitting device according to an example embodiment of the present disclosure. In FIGS. 6A through 6C, a partial region of the first electrode 170 of FIG. 5 is illustrated.

Referring to FIG. 6A, a first electrode 170a may have a first pattern portion 17A on a lower surface thereof and a second pattern portion 17B on an upper surface thereof. Unlike the first electrode 170 of the example embodiment of FIGS. 1 and 2, each of the first and second pattern portions 17A and 17B in the present example embodiment may include depressions and protrusions, rather than being smooth.

Such a shape of the first and second pattern portions 17A and 17B may be formed when cross-section is not smooth during the process of removing the light emitting nanostructures 140 described above with reference to FIGS. 3E and 3J. Also, the size and number of the depressions and protrusions may be variously modified.

Referring to FIG. 6B, the first electrode 170b may have a first pattern portion 17A on a lower surface thereof and a second pattern portion 17B on an upper surface thereof. Unlike the first electrode 170 of the example embodiment of FIGS. 1 and 2, the first pattern portion 17A may have a concave portion depressed from a lower surface thereof and the second pattern portion 17B may have a convex shape protruding from a upper surface thereof to correspond to the concave shape of the first pattern portion 17A.

The first and second pattern portions 17A and 17B may be formed when the first conductivity-type semiconductor cores 142 in the portions in which the light emitting nanostructures 140 partially remain or when the base layers 120 on the circumference of the light emitting nanostructures 140 are partially removed together, during a process of removing the light emitting nanostructures 140 described above with reference to FIGS. 3E and 3J.

Referring to FIG. 6C, the first electrode 170c may have a first pattern portion 17A on a lower surface thereof and a second pattern portion 17B on an upper surface thereof. Unlike the first electrode 170 of the example embodiment of FIGS. 1 and 2, the first pattern portion 17A may have a concave portion depressed from a lower surface thereof and the second pattern portion 17B may have a convex shape protruding from a upper surface thereof to correspond to the concave shape of the first pattern portion 17A. Also, each of the first and second pattern portions 17A and 17B may include depressions and protrusions, rather than being smooth.

The first and second pattern portions 17A and 17B may be formed when the first conductivity-type semiconductor cores 142 in the portions in which the light emitting nanostructures 140 partially remain or when the base layers 120 on the circumference of the light emitting nanostructures 140 are partially removed together, and when the cut surface is not smooth, during a process of removing the light emitting nanostructures 140 described above with reference to FIGS. 3E and 3J. Also, the size and number of the depressions and protrusions may be variously modified.

Only the first and second pattern portions 17A and 17B of the first electrodes 170a, 170b, and 170c are illustrated in FIGS. 6A through 6C, but those pattern portions may also be applied to the second electrode 180 (refer to FIGS. 1 and 2) in the same manner.

Figure 7A:
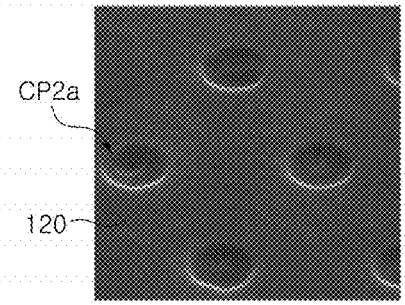
FIGS. 7A and 7B are microscopic images of regions of a semiconductor light emitting device according to an example embodiment of the present disclosure.
Figure 7B:
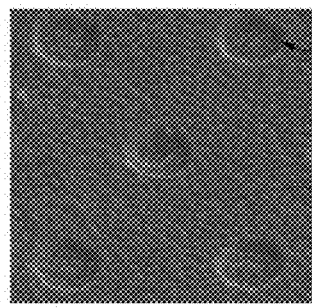

FIGS. 7A and 7B are microscopic images of a recessed upper surface of the base layer 120 corresponding to the second region R2 of FIGS. 5A and 5B and an upper surface of the first electrode 170 corresponding to the third region R3 of FIGS. 5A and 5B.

Referring to FIG. 7A, the concave portion CP2a may be formed on the gallium nitride (GaN)-based base layer 120. The concave portion CP2a according to the present example embodiment has a circular shape on a plane and may be depressed downwardly to a predetermined and/or desired depth from the upper surface of the base layer 120.

Referring to FIG. 7B, the second pattern portion 17B may be formed on the first electrode 17B formed of a metal. The second pattern portion 17B according to the present example embodiment has a circular shape similar to that of the concave portion CP2a and is depressed to a predetermined and/or desired depth from the upper surface of the first electrode 17B.

FIGS. 8A through 8D are cross-sectional views schematically illustrating a method of manufacturing a semiconductor light emitting device according to an example embodiment of the present disclosure. In FIGS. 8A through 8D, cross-sections corresponding to the configuration of FIG. 2 are illustrated and redundant descriptions with reference to FIGS. 3A through 3L will be omitted.

Figure 8A:
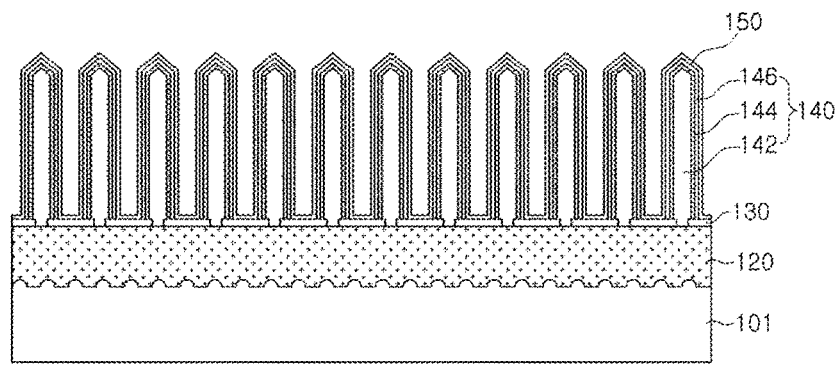
FIGS. 8A through 8D are cross-sectional views schematically illustrating a method of manufacturing a semiconductor light emitting device according to an example embodiment of the present disclosure.

Referring to FIG. 8A, light emitting nanostructures 140 and a transparent electrode layer 150 may be formed on a substrate 101.

The light emitting nanostructures 140 may be formed through the processes described above with reference to FIGS. 3A through 3C. Thereafter, the transparent electrode 150 may be formed on the second conductivity-type semiconductor layer 146. The transparent electrode layer 150 may extend to cover upper surfaces of a mask layer 130 between adjacent light emitting nanostructures 140, so as to be formed as a single layer.

Figure 8B:
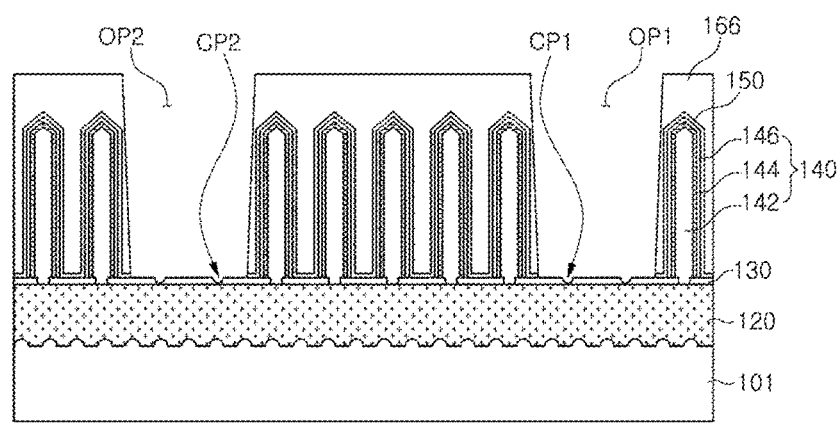

Referring to FIG. 8B, a third filler layer 166 having first and second openings OP1 and OP2 may be formed on the plurality of light emitting nanostructures 140, and the light emitting nanostructures 140 and the transparent electrode 150 exposed through the first and second openings OP1 and OP2 may be removed.

In the present example embodiment, the first and second openings OP1 and OP2 may be formed during a single process, and the process of removing the light emitting nanostructures 140 from the region in which first and second electrodes 170 and 180 (refer to FIGS. 1 and 2) may be performed as a single process. Also, in the example embodiment described above with reference to FIGS. 3E and 3J, only the light emitting nanostructures 140 are removed, but in the present example embodiment, the light emitting nanostructures 140 and the transparent electrode layer 150 on the light emitting nanostructures 140 may also be removed together. For example, as an aspect ratio of the light emitting nanostructures 140 increases, the process of removing the light emitting nanostructures 140 together with the transparent electrode layer 150 may be easily performed.

The first and second concave portions CP1 and CP2 may be formed in lower portions within the first and second openings OP1 and OP2 from which the light emitting nanostructures 140 were removed. Also, in an example embodiment, a portion of the transparent layer 150 may remain on the flat upper surface of the mask layer 130 where the first and second concave portions CP1 and CP2 are not formed.

Figure 8C:
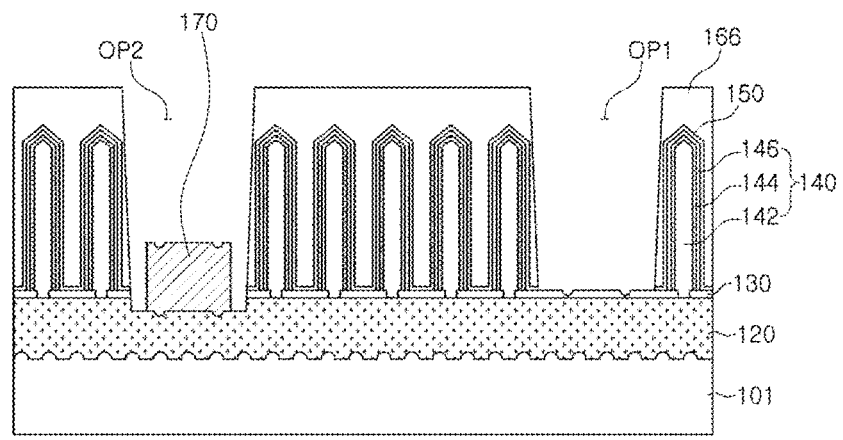

Referring to FIG. 8C, a first electrode 170 may be formed within the second opening OP2.

First, the first opening OP1 may be covered using a mask and the first electrode 170 may only be formed within the second opening OP2. Before the formation of the first electrode 170, the mask layer 130 exposed by the second opening OP2 is removed and a portion of the base layer 120 may be removed such that the base layer 120 is recessed. Also, when a portion of the transparent electrode 150 remains, it may be removed together with the mask layer 130.

Figure 8D:
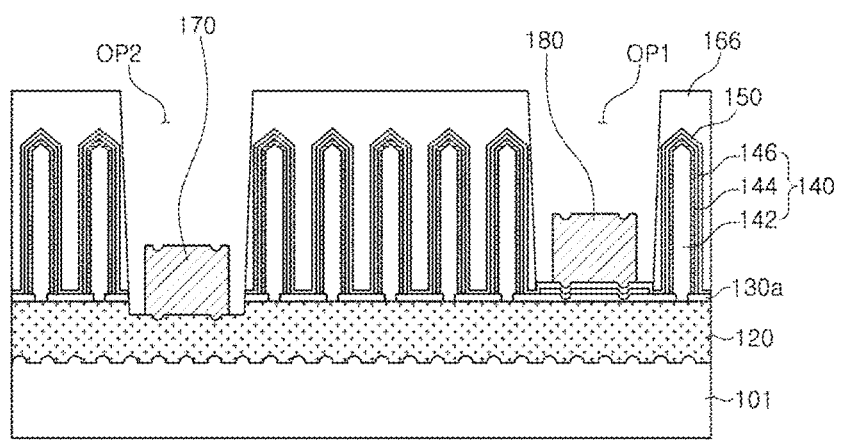

Referring to FIG. 8D, a second electrode 180 may be formed within the first opening OP1.

First, in order to allow the second electrode 180 to be electrically connected to the second conductivity-type semiconductor layer 146 of the light emitting nanostructure 140, the transparent electrode 150 may be formed on the mask layer 130 and the base layer 120 exposed by the first opening OP1 before the formation of the first electrode 170. In an example embodiment, after the third filler layer 166 is removed, the transparent electrode layer 150 may be formed to overlap the transparent electrode layer 150 on the circumference of the first opening OP1 by a predetermined and/or desired width.

Thereafter, the first electrode 170 is covered with a mask, and the second electrode 180 may only be formed within the first opening OP1.

Figure 9:
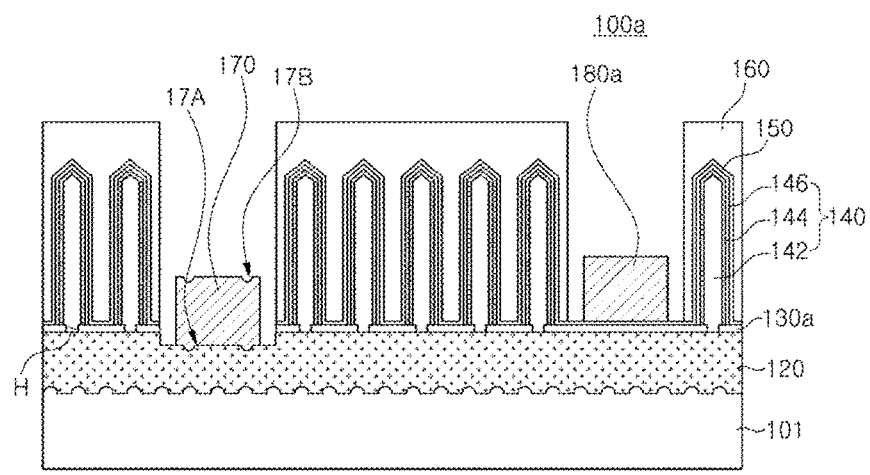
FIG. 9 is a cross-sectional view schematically illustrating a semiconductor light emitting device according to an example embodiment of the present disclosure.

FIG. 9 is a cross-sectional view schematically illustrating a semiconductor light emitting device according to an example embodiment of the present disclosure. Hereinafter, same reference numerals denote the same components, and thus, redundant descriptions thereof will be omitted.

Referring to FIG. 9, a semiconductor light emitting device 100a includes a substrate 101, and a base layer 120, a mask layer 130a, light emitting nanostructures 140, a transparent electrode layer 150, and a filler layer 160 formed on the substrate 101. Each of the light emitting nanostructures 140 includes a first conductivity-type semiconductor core 142, an active layer 144, and a second conductivity-type semiconductor layer 146 grown from the base layer 120 of a first conductivity-type semiconductor. The semiconductor light emitting device 100a may further include first and second electrodes 170 and 180a electrically connected to the base layer 120 and the second conductivity-type semiconductor layer 146, respectively.

The first and second electrodes 170 and 180a may be disposed on the base layer 120 and the transparent electrode layer 150 on one sides of the semiconductor light emitting device 100a, respectively, so as to be electrically connected to the base layer 120 and the second conductivity-type semiconductor layer 146, respectively. The first and second electrodes 170 and 180a may be disposed in the same direction with respect to the substrate 101.

Unlike the example embodiment of FIG. 2, the second electrode 180a may be disposed on the mask layer 130a in which an opening H is not formed. Namely, the mask layer 130a is disposed without an opening H below the second electrode 180a, to electrically insulate the second electrode 180a from the base layer 120. Also, the first electrode 170 may have first and second pattern portions 17A and 17B respectively formed on upper and lower surfaces thereof, while the second electrode 180a may have flat upper and lower surfaces. Also, the transparent layer 150 and the mask layer 130a below the second electrode 180a may have flat surfaces.

The semiconductor light emitting device 100a according to the present example embodiment may be manufactured by not forming an opening H in a portion of the mask layer 130a such that the light emitting nanostructure 140 is not formed in the region in which the second electrode 180a is to be formed, in the method for manufacturing a semiconductor light emitting device described above with reference to FIGS. 3A through 3L. Thus, a process of removing a light emitting nanostructure 140 is not performed in the region in which the second electrode 180a is to be formed, and thus, the second electrode 180a may be formed on the flat mask layer 130a and the flat transparent electrode layer 150. The first electrode 170 may be formed by using the processes described above with reference to FIGS. 3I through 3L, and the first electrode 170 may first be formed.

Figure 10:
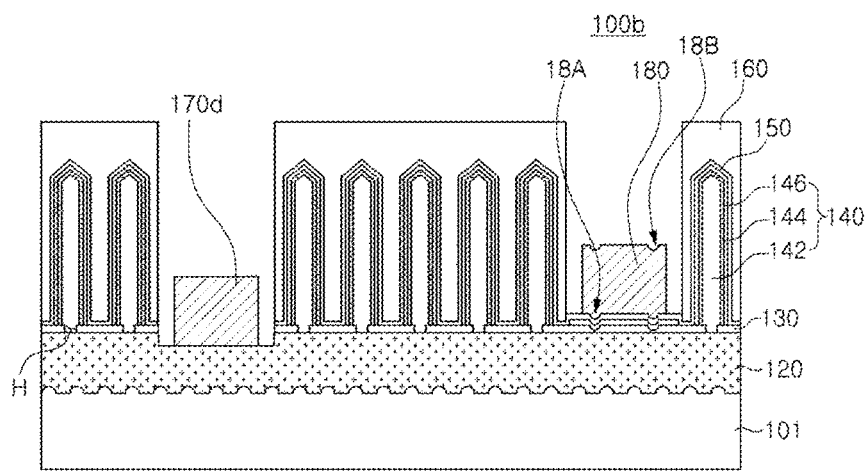
FIG. 10 is a cross-sectional view schematically illustrating a semiconductor light emitting device according to an example embodiment of the present disclosure.

FIG. 10 is a cross-sectional view schematically illustrating a semiconductor light emitting device according to an example embodiment of the present disclosure.

Referring to FIG. 10, a semiconductor light emitting device 100b includes a substrate 101, and a base layer 120, a mask layer 130, light emitting nanostructures 140, a transparent electrode layer 150, and a filler layer 160 formed on the substrate 101. Each of the light emitting nanostructures 140 includes a first conductivity-type semiconductor core 142, an active layer 144, and a second conductivity-type semiconductor layer 146 grown from the base layer 120 of a first conductivity-type semiconductor. The semiconductor light emitting device 100b may further include first and second electrodes 170d and 180 electrically connected to the base layer 120 and the second conductivity-type semiconductor layer 146, respectively.

The first and second electrodes 170d and 180 may be disposed on the base layer 120 and the transparent electrode layer 150 on one sides of the semiconductor light emitting device 100b, respectively, so as to be electrically connected to the base layer 120 and the second conductivity-type semiconductor layer 146, respectively. The first and second electrodes 170d and 180 may be disposed in the same direction with respect to the substrate 101.

Unlike the example embodiment of FIG. 2, the first electrode 170d may be disposed on a flat surface of a recessed base layer 120. Also, the second electrode 180 may have first and second pattern portions 18A and 18B respectively formed on upper and lower surfaces, while the first electrode 170d may have flat upper and lower surfaces. In an example embodiment, the first electrode 170d may be formed on a base layer 120 which is not recessed.

The semiconductor light emitting device 100b according to the present example embodiment may be manufactured by not forming an opening H in a portion of the mask layer 130 such that a light emitting nanostructure 140 is not formed in the region in which the first electrode 170d is to be formed, in the method for manufacturing a semiconductor light emitting device described above with reference to FIGS. 3A through 3L. Thus, a process of removing a light emitting nanostructure 140 is not performed in the region in which the first electrode 170d is to be formed, and thus, portions of the flat mask layer 130 and the base layer 120 may be removed together and the first electrode 170d may subsequently be formed on the base layer 120. The second electrode 180 may be formed by using the processes described above with reference to FIGS. 3I through 3L, and the first electrode 170d may first be formed.

In an example embodiment, in a case in which the first electrode 170d is formed on the base layer 120 without being recessed, only the flat mask layer 130 is removed during the foregoing process and the first electrode 170d may subsequently be formed on the flat base layer 120.

As in the example embodiment described above with reference to FIGS. 9 and 10, in some example embodiment of the present disclosure, only any one of the first and second electrodes 170 and 180 may include the first and second pattern portions 17A, 18A, 17B, and 18B. Also, either one or both of the first and second electrodes 170 and 180 may be recessed.

Figure 11:
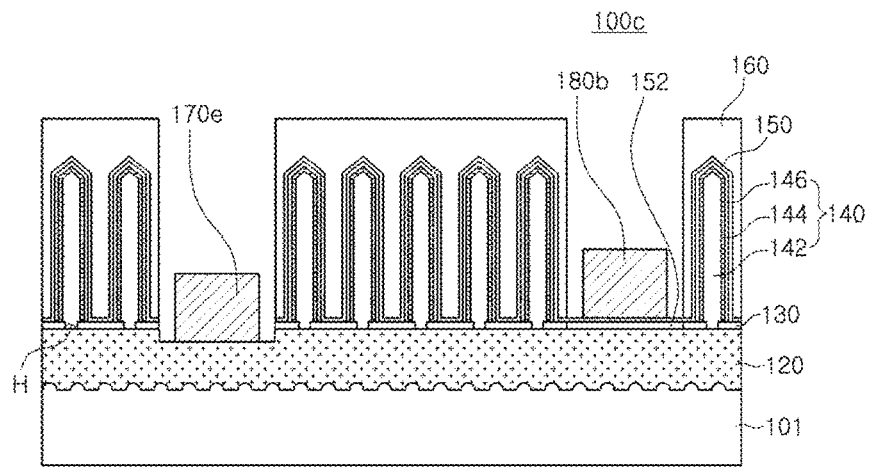
FIG. 11 is a cross-sectional view schematically illustrating a semiconductor light emitting device according to an example embodiment of the present disclosure.

FIG. 11 is a cross-sectional view schematically illustrating a semiconductor light emitting device according to an example embodiment of the present disclosure.

Referring to FIG. 11, a semiconductor light emitting device 100c includes a substrate 101, and a base layer 120, a mask layer 130, light emitting nanostructures 140, a transparent electrode layer 150, an electrode insulating layer 152, and a filler layer 160 formed on the substrate 101. Each of the light emitting nanostructures 140 includes a first conductivity-type semiconductor core 142, an active layer 144, and a second conductivity-type semiconductor layer 146 grown from the base layer 120 of a first conductivity-type semiconductor. The semiconductor light emitting device 100c may further include first and second electrodes 170e and 180b electrically connected to the base layer 120 and the second conductivity-type semiconductor layer 146, respectively.

The first and second electrodes 170e and 180b may be disposed on the base layer 120 and the transparent electrode layer 150 on one sides of the semiconductor light emitting device 100c, respectively, so as to be electrically connected to the base layer 120 and the second conductivity-type semiconductor layer 146, respectively. The first and second electrodes 170e and 180b may be disposed in the same direction with respect to the substrate 101.

Unlike the example embodiment of FIG. 2, the first and second electrodes 170e and 180b may be disposed on flat surfaces of the base layer 120 and the transparent electrode layer 150. The first and second electrodes 170e and 180b may have flat upper and lower surfaces. Also, the mask layer 130 may not be disposed below the second electrode 180b.

The semiconductor light emitting device 100c according to the present example embodiment may be manufactured by removing the mask layer 130 with the first and second concave portions CP1 and CP2 formed thereon in the regions in which the first and second electrodes 170e and 180b are to be formed, and subsequently forming the first and second electrodes 170e and 180b, in the method for manufacturing a semiconductor light emitting device described above with reference to FIGS. 3A through 3L. In the region in which the second electrode 180b is formed, the electrode insulating layer 152 may be formed on the base layer 120.

Alternatively, in the case of the first electrode 170e, when a portion of the base layer 120 is removed, a process condition such as an etching condition may be adjusted to form the base layer 120 having a flat surface, and the first electrode 170e may be formed on the base layer 120. In the case of the second electrode 180b, when the electrode insulating layer 152 or the transparent electrode layer 150 is formed on the mask layer 130, deposition conditions may be adjusted to have flat surfaces to form the second electrode 180b thereon.

Figure 12:
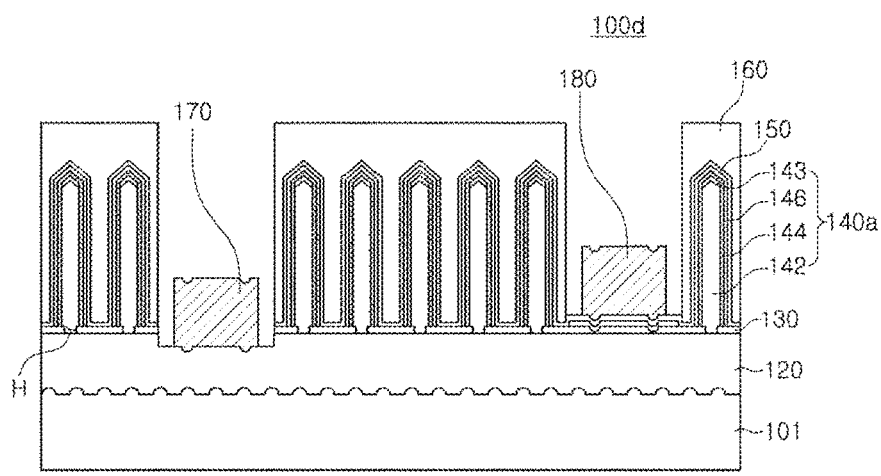
FIG. 12 is a cross-sectional view schematically illustrating a semiconductor light emitting device according to an example embodiment of the present disclosure.

FIG. 12 is a cross-sectional view schematically illustrating a semiconductor light emitting device according to an example embodiment of the present disclosure.

Referring to FIG. 12, a semiconductor light emitting device 100d includes a substrate 101, and a base layer 120, a mask layer 130, light emitting nanostructures 140a, a transparent electrode layer 150, and a filler layer 160 formed on the substrate 101. Each of the light emitting nanostructures 140a includes a first conductivity-type semiconductor core 142, a highly resistive layer 143, an active layer 144, and a second conductivity-type semiconductor layer 146 grown from the base layer 120. The semiconductor light emitting device 100d may further include first and second electrodes 170 and 180 electrically connected to the base layer 120 and the second conductivity-type semiconductor layer 146, respectively.

In the present example embodiment, the highly resistive layer 143 may be further disposed on a sloped surface of the tip portion of the first conductivity-type semiconductor core 142. However, according to an example embodiment, the highly resistive layer 143 may also be disposed on the surface of the active layer 144.

The highly resistive layer 143 may be formed of a material having high electrical resistance to block a leakage current that may be generated in the tip portion of the first conductivity-type semiconductor core 142. For example, the highly resistive layer 143 may be formed of an undoped semiconductor or a semiconductor doped with an impurity of a conductivity type opposite to that of the first conductivity-type semiconductor core 142. For example, in a case in which the first conductivity-type semiconductor core 142 is an n-type gallium nitride (n-GaN), the highly resistive layer 143 may be an undoped gallium nitride (GaN) or a gallium nitride (GaN) doped with a p-type impurity such as magnesium (Mg). However, the composition of the highly resistive layer 143 may vary according to example embodiments, and after the first conductivity-type semiconductor core 142 of gallium nitride (GaN) is grown, a source of at least one of aluminum (Al) and indium (In) may be additionally supplied in-situ to form a layer formed of an aluminum indium gallium nitride having a composition of $Al_xIn_yGa_{1-x-y}N$ ($0 \leq x < 1$, $0 \leq y < 1$, $0 \leq x+y < 1$), as the highly resistive layer 143.

Since the semiconductor light emitting device 100*d* according to the present example embodiment includes the mask layer 130 and the highly resistive layer 143 having a heterogeneous interface, a leakage current may be effectively blocked in both upper and lower portions of the light emitting nanostructures 140*a*.

Figure 13A:
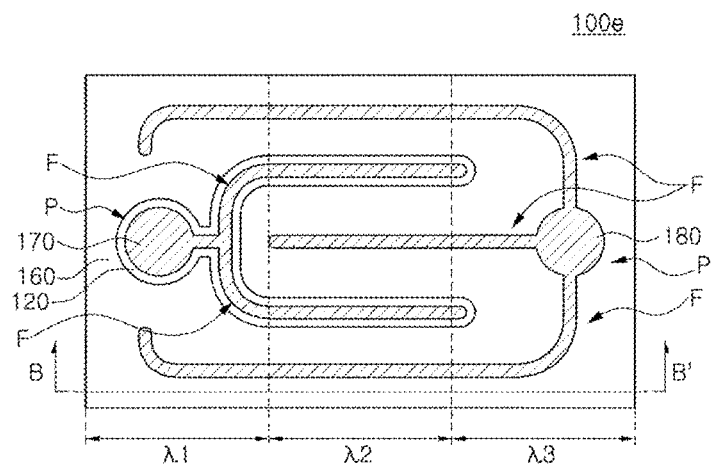
FIGS. 13A and 13B are a plan view and a perspective view schematically illustrating a semiconductor light emitting device according to an example embodiment of the present disclosure.
Figure 13B:
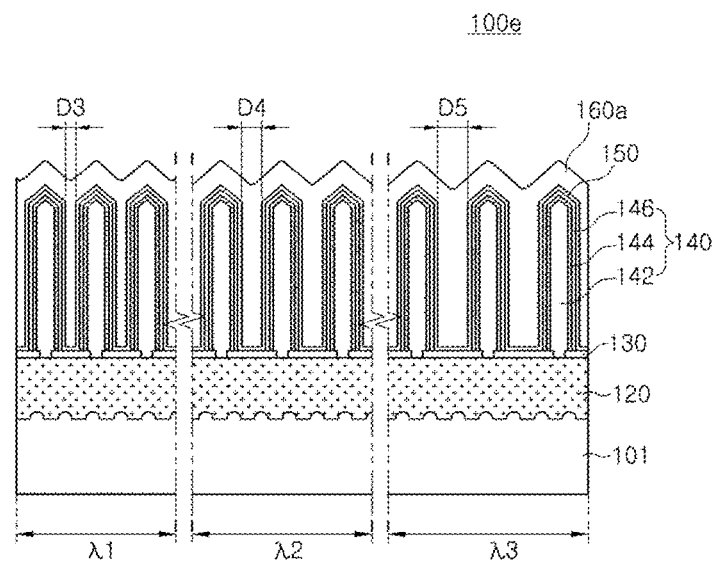

FIGS. 13A and 13B are a plan view and a perspective view schematically illustrating a semiconductor light emitting device according to an example embodiment of the present disclosure. Specifically, FIG. 13B illustrates an arrangement of light emitting nanostructures 140 in first to third wavelength regions λ1, λ2, and λ3 of FIG. 13A.

Referring to FIGS. 13A and 13B, a semiconductor light emitting device 100*e* includes a substrate 101, and a first conductivity-type semiconductor base layer 120, an insulating layer 130, light emitting nanostructures 140, a transparent electrode layer 150, and a filler layer 160*a* formed on the substrate 101. Each of the light emitting nanostructures 140 includes a first conductivity-type semiconductor core 142, an active layer 144, and a second conductivity-type semiconductor layer 146 grown from the first conductivity-type semiconductor base layer 120. The semiconductor light emitting device 100*e* may further include first and second electrodes 170 and 180 electrically connected to the base layer 120 and the second conductivity-type semiconductor layer 146, respectively.

The semiconductor light emitting device 100*e* according to the present example embodiment includes first to third wavelength regions λ1, λ2, and λ3, and distances D3, D4, and D5 between the light emitting nanostructures 140 in the regions, respectively, may differ. The third distance D3 is smallest, and the fifth distance D5 may be largest.

As in the present example embodiment, when the semiconductor light emitting device 100*e* includes the first to third wavelength regions λ1, λ2, and λ3 in which the distances between the light emitting nanostructures 140 vary, the content of indium (In) of the active layer 144 in the light emitting nanostructures 140 grown respectively in the regions or growth thicknesses may differ. For example, in a case in which the light emitting nanostructures 140 are grown under the same growth conditions, the content of indium (In) of the active layer 144 may increase and the growth thickness may increase as the distance between the light emitting nanostructures 140 is greater. Thus, the light emitting nanostructures 140 in the first to third wavelength regions λ1, λ2, and λ3 may emit light having different wavelengths, and white light may be emitted by mixing the light having different wavelengths.

In an example embodiment, sizes of the light emitting nanostructures 140 may be different in the first to third wavelength regions λ1, λ2, and λ3.

In the present example embodiment, the filler layer 160*a* may have an uneven upper surface in accordance with the shape of the light emitting nanostructures 140.

Figure 14:
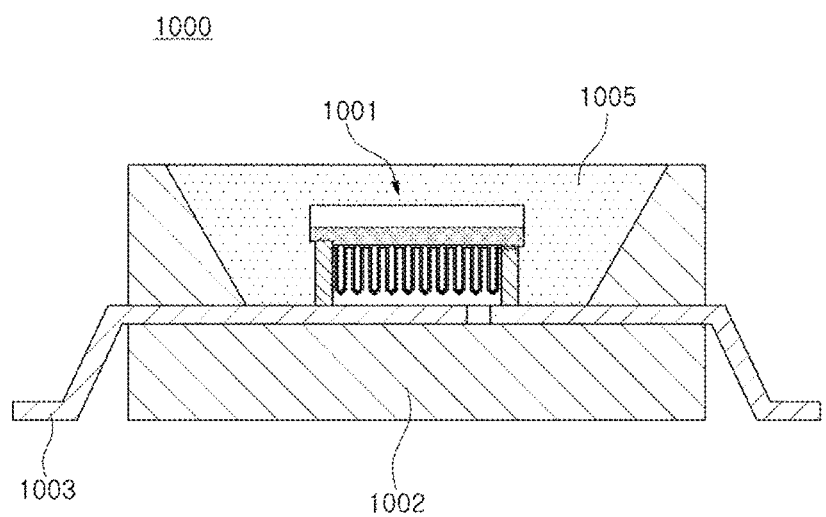
FIGS. 14 and 15 are views illustrating examples of packages employing a semiconductor light emitting device according to an example embodiment of the present disclosure.
Figure 15:
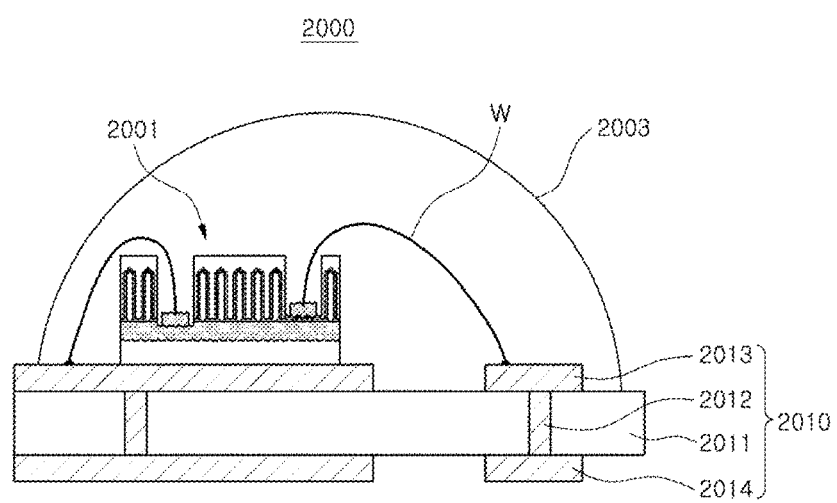

FIGS. 14 and 15 are views illustrating examples of packages employing a semiconductor light emitting device according to an example embodiment of the present disclosure.

Referring to FIG. 14, a semiconductor light emitting device package 1000 may include a semiconductor light emitting device 1001, a package body 1002, and a pair of lead frames 1003. The semiconductor light emitting device 1001 may be flipchip-mounted on the lead frames 1003 and electrically connected to the lead frames 1003 through electrodes of the semiconductor light emitting device 1001. According to an example embodiment, the semiconductor light emitting device 1001 may also be mounted on a different region, for example, on the package body 1002, rather than on the lead frames 1003. The package body 1002 may have a cup shape to improve reflectivity efficiency of light. An encapsulant 1005 formed of a light-transmissive material may be formed in the reflective cup to encapsulate the semiconductor light emitting device 1001, wires W, and the like.

In the present example embodiment, the semiconductor light emitting device package 1000 is illustrated as including the semiconductor light emitting device 1001 having a structure similar to that of the semiconductor light emitting device 100 illustrated in FIGS. 1 and 2 and including the first and second electrodes 170 and 180 with different heights, but it may also include the semiconductor light emitting device 100*a*, 100*b*, 100*c*, or 100*d* according to another example embodiment of the present disclosure as described above with reference to FIGS. 9, 10, 11, and 12.

Referring to FIG. 15, a semiconductor light emitting device package 2000 may include a semiconductor light emitting device 2001, a mounting board 2010, and an encapsulant 2003. The semiconductor light emitting device 2001 may be mounted on the mounting board 2010 and electrically connected to the mounting board 2010 through wires W.

The mounting board 2010 may include a board body 2011, an upper electrode pad 2013, and a lower electrode pad 2014. Also, the mounting board 2010 may include a through electrode 2012 connecting the upper electrode pad 2013 and the lower electrode pad 2014. The mounting board 2010 may be provided as a board such as a printed circuit board (PCB), a metal-core printed circuit board (MCPCB), a metal printed circuit board (MPCB), a flexible printed circuit board (FPCB), or the like, and the structure of the mounting board 2010 may be applied to have various forms.

The encapsulant 2003 may be formed to have a lens structure with an upper surface having a convex dome shape. However, according to an example embodiment, the encapsulant 2003 may have a lens structure having a convex or concave surface to adjust a beam angle of light emitted through an upper surface of the encapsulant 2003.

In the present example embodiment, the semiconductor light emitting device package 2000 is illustrated as including the semiconductor light emitting device 2001 having a structure identical to that of the semiconductor light emitting device 100 illustrated in FIG. 1, but, according to an example embodiment, the semiconductor light emitting device package 2000 may include the semiconductor light emitting device 100*a*, 100*b*, 100*c*, or 100*d* according to another example embodiment of the present disclosure described above with reference to FIGS. 9, 10, 11, and 12.

Figure 16:
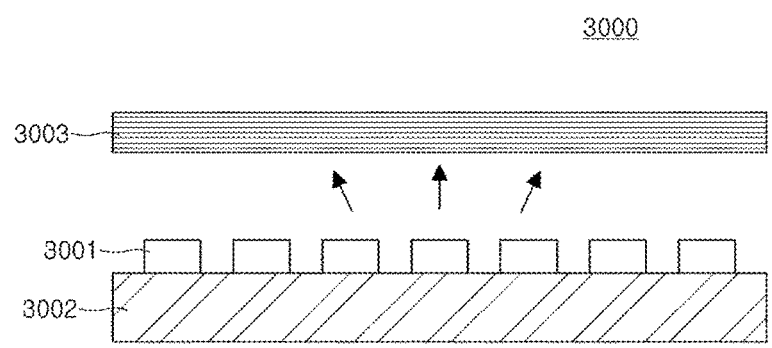
FIGS. 16 and 17 are examples of backlight units employing a semiconductor light emitting device according to an example embodiment of the present disclosure.
Figure 17:
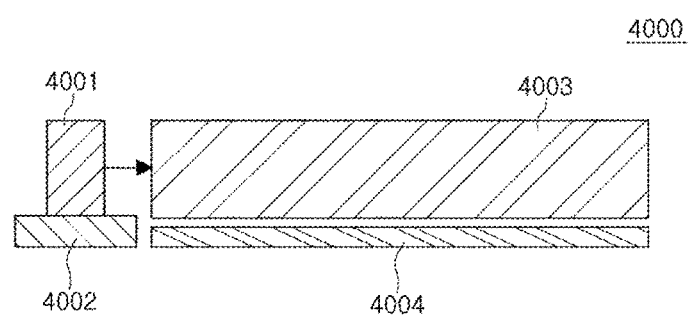

FIGS. 16 and 17 are examples of backlight units employing a semiconductor light emitting device according to an example embodiment of the present disclosure.

Referring to FIG. 16, a backlight unit 3000 includes light sources 3001 mounted on a substrate 3002 and one or more optical sheets 3003 disposed above the light sources 3001. The semiconductor light emitting device package having the structure described above with reference to FIGS. 14 and 15 or a structure similar thereto may be used as the light sources 3001. Alternatively, a semiconductor light emitting device may directly be mounted on the substrate 3002 (a so-called COB type) and used.

Unlike the backlight unit 3000 in FIG. 16 in which the light sources 3001 emit light toward an upper side where a liquid crystal display is disposed, a backlight unit 4000 as another example illustrated in FIG. 17 is configured such that a light source 4001 mounted on a substrate 4002 emits light in a lateral direction, and the emitted light may be made to be incident to a light guide plate 4003 so as to be converted into a surface light source. Light, passing through the light guide plate 4003, is emitted upwards, and in order to enhance light extraction efficiency, a reflective layer 4004 may be disposed on a lower surface of the light guide plate 4003.

Figure 18:
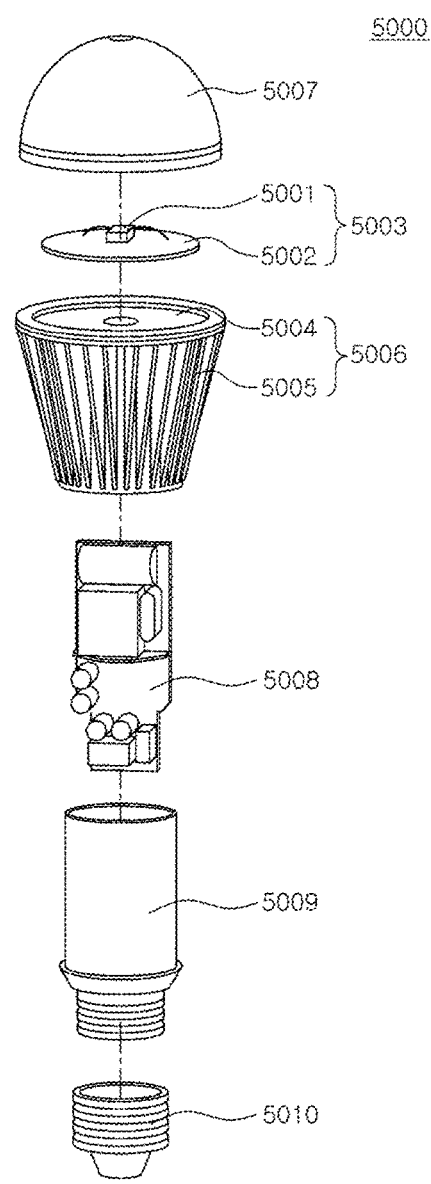
FIG. 18 is a view illustrating an example of a lighting device employing a semiconductor light emitting device according to an example embodiment of the present disclosure.

FIG. 18 is a view illustrating an example of a lighting device employing a semiconductor light emitting device according to an example embodiment of the present disclosure.

Referring to the exploded perspective view of FIG. 18, a lighting device 5000 is illustrated as, for example, a bulb-type lamp and includes a light emitting module 5003, a driving unit 5008, and an external connection unit 5010. The lighting device 5000 may further include external structures such as external and internal housings 5006 and 5009 and a cover unit 5007. The light emitting module 5003 may include a semiconductor light emitting device 5001 having a structure identical or similar to that of the semiconductor light emitting device 100, 100a, 100b, 100c, or 100d described above with reference to FIGS. 1, 9, 10, 11, and 12 and a circuit board 5002 with the semiconductor light emitting device 5001 mounted thereon. In the present example embodiment, it is illustrated that a single semiconductor light emitting device 5001 is mounted on the circuit board 5002, but a plurality of semiconductor light emitting devices may be installed as needed. Also, the semiconductor light emitting device 5001 may be manufactured as a package and subsequently mounted, rather than being directly mounted on the circuit board 5002.

The external housing 5006 may serve as a heat dissipation unit and may include a heat dissipation plate 5004 disposed to be in direct contact with the light emitting module 5003 to enhance heat dissipation and heat dissipation fins 5005 surrounding the lateral surfaces of the lighting device 5000. The cover unit 5007 may be installed on the light emitting module 5003 and have a convex lens shape. The driving unit 5008 may be installed in the internal housing 5009 and connected to the external connection unit 5010 having a socket structure to receive power from an external power source. Also, the driving unit 5008 may serve to convert power into an appropriate current source for driving the semiconductor light emitting device 5001 of the light emitting module 5003, and provide the same. For example, the driving unit 5008 may be configured as an AC-DC converter, a rectifying circuit component, or the like.

Also, although not shown, the lighting device 5000 may further include a communications module.

Figure 19:
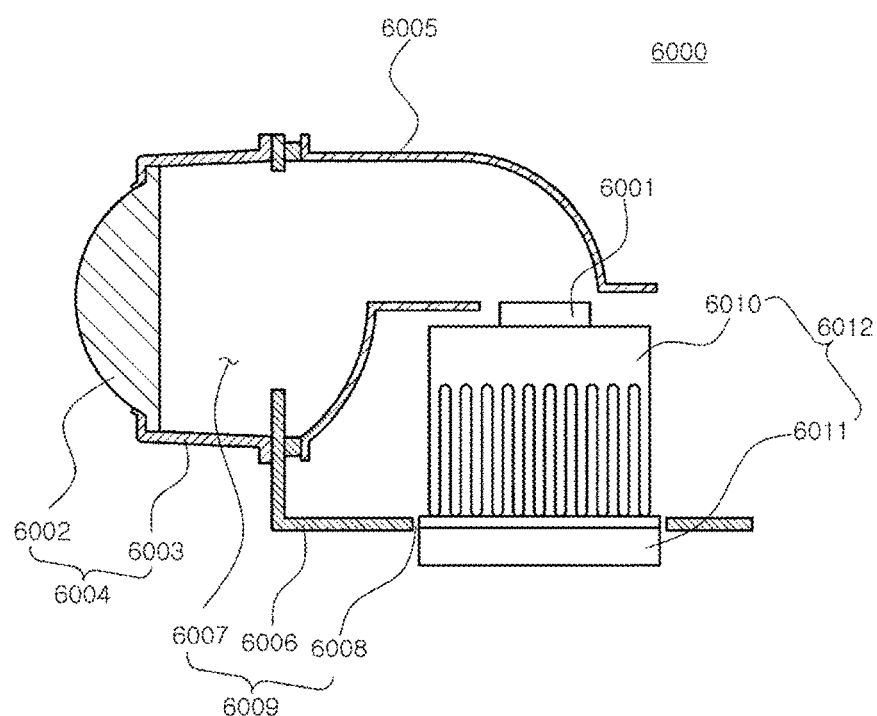
FIG. 19 is a view illustrating an example of a headlamp employing a semiconductor light emitting device according to an example embodiment of the present disclosure.

FIG. 19 is a view illustrating an example of a headlamp employing a semiconductor light emitting device according to an example embodiment of the present disclosure.

Referring to FIG. 19, a headlamp 6000 used as a vehicle lamp, or the like, may include a light source 6001, a reflective unit 6005, and a lens cover unit 6004. The lens cover unit 6004 may include a hollow guide 6003 and a lens 6002. The light source 6001 may include at least one of semiconductor light emitting device packages of FIGS. 14 and 15. The headlamp 6000 may further include a heat dissipation unit 6012 outwardly dissipating heat generated by the light source 6001. In order to effectively dissipate heat, the heat dissipation unit 6012 may include a heat sink 6010 and a cooling fan 6011. Also, the headlamp 6000 may further include a housing 6009 fixedly supporting the heat dissipation unit 6012 and the reflective unit 6005, and the housing 6009 may have a body unit 6006 and a central hole 6008 formed in one surface thereof, in which the heat dissipation unit 6012 is coupled. Also, the housing 6009 may have a front hole 6007 formed in the other surface integrally connected to the one surface and bent in a right angle direction. The reflective unit 6005 is fixed to the housing 6009 such that light generated by the light source 6001 is reflected thereby to pass through the front hole 6007 so as to be output outwardly.

As set forth above, according to example embodiments of the present disclosure, a semiconductor light emitting device in which light emitting nanostructures in the region in which electrodes are to be formed are removed and electrodes are formed therein, thus having uniform optical characteristics and enhanced reliability, a method for manufacturing a semiconductor light emitting device, and a method for manufacturing a semiconductor light emitting device package may be provided.

Advantages and effects of the present disclosure are not limited to the foregoing content and may be easily understood from the described specific example embodiments of the present disclosure.

While example embodiments have been shown and described above, it will be apparent to those skilled in the art that modifications and variations could be made without departing from the scope of the present invention as defined by the appended claims.

What is claimed is:

1. A semiconductor light emitting device comprising:
a substructure including at least one light emitting region including a plurality of three-dimensional (3-D) light emitting nanostructures and at least one electrode region including a plurality of locations wherein an arrangement of the plurality of three-dimensional (3-D) light emitting nanostructures and the plurality of locations are identical.

2. The semiconductor light emitting device of claim 1, wherein the plurality of locations are at least one of depressions, protrusions, and locations where other light emitting nanostructures were formed and removed.

3. The semiconductor light emitting device of claim 1, wherein the at least one electrode region includes a first conductivity-type semiconductor region and a second conductivity-type semiconductor region.

4. The semiconductor light emitting device of claim 1, wherein each three-dimensional (3-D) nanostructure includes a first conductivity-type semiconductor core, an active layer, and a second conductivity-type semiconductor shell.

5. The semiconductor light emitting device of claim 1, the substructure further including a substrate, a base layer on the substrate, and a mask layer on the base layer.

6. The semiconductor light emitting device of claim 5, further comprising: a first conductivity-type electrode on the base layer and a second conductivity-type electrode on the mask layer.

7. The semiconductor light emitting device of claim 1, further comprising:
a transparent electrode layer covering the plurality of three-dimensional (3-D) light emitting nanostructures.

8. The semiconductor light emitting device of claim 7, further comprising:
a filler layer on the transparent electrode layer and the plurality of three-dimensional (3-D) light emitting nanostructures.

9. The semiconductor light emitting device of claim 8, wherein,
the substructure further includes a substrate, a base layer on the substrate, and a mask layer on the base layer, and
the semiconductor light emitting device further includes,
a first conductivity-type electrode on the base layer and
a second conductivity-type electrode on the mask layer, and
an electrode insulating layer between the mask layer and the second conductivity-type electrode.

10. The semiconductor light emitting device of claim 1, wherein the plurality of three-dimensional (3-D) light emitting nanostructures are arranged in a hexagonal pattern of equal pitch.

11. The semiconductor light emitting device of claim 4, wherein the first conductivity-type semiconductor core is made of an n-type gallium nitride (n-GaN) doped with silicon (Si) or carbon (C), the active layer includes indium gallium nitride (InGaN), and the second conductivity-type semiconductor shell is made of a p-type gallium nitride (p-GaN) doped with magnesium (Mg) or zinc (Zn).

12. The semiconductor light emitting device of claim 1, wherein,
the at least one light emitting region includes three light emitting regions and the plurality of 3-D light emitting nanostructures includes three sets of 3-D light emitting nanostructures,
each light emitting region of the three light emitting regions includes a separate set of the three sets of 3-D light emitting nanostructures, and
the separate sets of 3-D light emitting nanostructures have different pitches, respectively, such that one set of 3-D light emitting nanostructures have greater pitches than a remainder two sets of 3-D light emitting nanostructures.

13. The semiconductor light emitting device of claim 12, wherein the one set of three-dimensional (3-D) light emitting nanostructures with greater pitches further have at least one of greater growth thickness, greater Indium (In) content and greater wavelength than the remainder two sets of 3-D light emitting nanostructures.

14. The semiconductor light emitting device of claim 1, wherein,
each 3-D light emitting nanostructure includes an individual center,
a distance between respective centers of adjacent 3-D light emitting nanostructures is a first pitch,
at least one 3-D light emitting nanostructure of the plurality of 3-D light emitting nanostructures is adjacent to the plurality of locations,
a distance between a center of the at least one 3-D light emitting nanostructure and an adjacent location of the plurality of locations is a second pitch,
a distance between respective centers of adjacent locations of the plurality of locations is a third pitch, and
the first pitch, the second pitch, and the third pitch are all substantially equal.

15. The semiconductor light emitting device of claim 1, wherein a cross-sectional area of each of the plurality of locations is greater than a cross-section of each of the plurality of three-dimensional (3-D) light emitting nanostructures.

16. The semiconductor light emitting device of claim 4, wherein each three-dimensional (3-D) nanostructure further includes a highly resistive layer on a portion of the first conductivity-type semiconductor core.

17. A semiconductor light emitting device comprising:
a substrate including at least one light emitting region, a first electrode region, and a second electrode region;
a base layer on the substrate;
a mask layer on the base layer;
a plurality of three-dimensional (3-D) light emitting nanostructures in a plurality of openings in the mask layer on the at least one light emitting region;
a first electrode on the first electrode region; and
a second electrode on the second electrode region;
wherein each of the first electrode on the first electrode region, the second electrode on the second region, the mask layer on the first and second electrode regions, and the base layer on the first and second electrode regions includes a separate plurality of locations, each plurality of locations having a common pattern with a pattern of the plurality of three-dimensional (3-D) light emitting nanostructures in the at least one light emitting region.

18. The semiconductor light emitting device of claim 17, further comprising:
a transparent electrode layer covering the plurality of three-dimensional (3-D) light emitting nanostructures;
a filler layer on the transparent electrode layer and the plurality of three-dimensional (3-D) light emitting nanostructures; and
an electrode insulating layer between the mask layer and the second electrode.

19. The semiconductor light emitting device of claim 17, wherein each of the plurality of three-dimensional (3-D) nanostructures includes a first conductivity-type semiconductor core, an active layer, and a second conductivity-type semiconductor shell.

20. The semiconductor light emitting device of claim 19, wherein the first conductivity-type semiconductor core is made of an n-type gallium nitride (n-GaN) doped with silicon (Si) or carbon (C), the active layer includes indium gallium nitride (InGaN), and the second conductivity-type semiconductor shell is made of a p-type gallium nitride (p-GaN) doped with magnesium (Mg) or zinc (Zn).

* * * * *